United States Patent
Chang et al.

(10) Patent No.: US 6,415,426 B1
(45) Date of Patent: Jul. 2, 2002

(54) DYNAMIC WEIGHTING AND/OR TARGET ZONE ANALYSIS IN TIMING DRIVEN PLACEMENT OF CELLS OF AN INTEGRATED CIRCUIT DESIGN

(75) Inventors: Shing-Chong Chang, Saratoga; Xuequn Xiang, Foster City; Ihao Chen; Shiang-Tang Huang, both of San Jose, all of CA (US)

(73) Assignee: Incentia Design Systems, Inc., Santa Clara, CA (US)

( * ) Notice: Subject to any disclaimer, the term of this patent is extended or adjusted under 35 U.S.C. 154(b) by 167 days.

(21) Appl. No.: 09/586,217

(22) Filed: Jun. 2, 2000

(51) Int. Cl.[7] ............................................. G06F 9/45

(52) U.S. Cl. ................................. 716/9; 716/10

(58) Field of Search ..................... 716/6–13, 1–2, 716/16–18

(56) References Cited

U.S. PATENT DOCUMENTS

| | | | |
|---|---|---|---|
| 4,484,292 A | | 11/1984 | Hong et al. ................ 716/13 |
| 4,908,772 A | | 3/1990 | Chi ............................ 716/10 |
| 4,931,946 A | | 6/1990 | Ravindra et al. ........... 700/279 |
| 5,224,057 A | | 6/1993 | Igarashi et al. |
| 5,267,176 A | | 11/1993 | Antreich et al. ........... 716/10 |
| 5,309,370 A | | 5/1994 | Wong ........................ 716/13 |
| 5,422,317 A | * | 6/1995 | Hua et al. ................. 438/129 |
| 5,566,078 A | | 10/1996 | Ding et al. ................. 716/8 |
| 5,587,923 A | | 12/1996 | Wang ........................ 716/13 |
| 5,638,293 A | | 6/1997 | Scepanovic et al. ........ 716/8 |
| 5,778,216 A | * | 7/1998 | Venkatesh ................ 713/500 |
| 5,818,729 A | | 10/1998 | Wang et al. ................ 716/9 |
| 5,831,863 A | | 11/1998 | Scepanovic et al. ........ 716/9 |
| 5,841,672 A | | 11/1998 | Spyrou et al. ............. 716/6 |
| 5,844,811 A | * | 12/1998 | Scepanovic et al. ........ 716/10 |
| 5,867,398 A | | 2/1999 | Scepanovic et al. ........ 716/9 |
| 5,933,356 A | | 8/1999 | Rostoker et al. .......... 703/15 |
| 5,953,236 A | * | 9/1999 | Hossain et al. ............ 716/11 |
| 5,963,455 A | | 10/1999 | Scepanovic et al. ........ 716/3 |
| 6,192,508 B1 | * | 2/2001 | Malik et al. ............... 716/10 |
| 6,230,304 B1 | * | 5/2001 | Groeneveld et al. ........ 716/7 |
| 6,286,128 B1 | * | 9/2001 | Pileggi et al. ............. 716/10 |

OTHER PUBLICATIONS

Dunlop et al., "A Procedure for Placement of Standard–Cell VLSI Circuits", IEEE Transactions on Computer Aided Design, vol. CAD–4, No. 1, 1/85, pp. 92–98.

Elmore, "The Transient Response of Damped Linear Network with Particular Regard to Wideband Amplifiers", (1948). Journal of Applied Physics, vol. 19, Jan., pp. 55–63.

Fiduccia et al., "A Linear–Time Heuristic for Improving Network Partitions", 19th Design Automation Conference, IEEE (1982), pp. 175–181.

Kleinhans et al., "Gordian: VLSI Placement by Quadratic Programming and Slicing Optimization", IEEE Transactions on Computer Aided Design, vol. 10, No. 3, Mar. 1991, pp. 356–365.

(List continued on next page.)

Primary Examiner—Matthew Smith
Assistant Examiner—Paul Dinh
(74) Attorney, Agent, or Firm—Morrison & Foerster, LLP

(57) ABSTRACT

A novel global placement process and associated computer software are provided for global placement of functional cells of an integrated circuit design. The global placement process is recursive and timing driven. Functional cells are placed according to how that placement is likely to influence signal timing. Also, a novel detailed placement process and associated computer software is provided for detailed placement of functional cells of an integrated circuit design. Target zones are defined which provide indications of the timing impact of functional cell movement. A detailed search for improved cell placements is conducted in which target zones are used to assess the signal timing impact of proposed cell movements. The novel global placement produces a global cell placement result, and the novel detailed placement process produces an improved detailed placement result.

26 Claims, 7 Drawing Sheets

OTHER PUBLICATIONS

Rubinstein et al., "Signal Delay in RC Tree Networks", IEEE Transactions on Computer–Aided Design, vol. CAD–2, No. 3, Jul. 1983, pp. 202–211.

Ray–Song Tsay et al., "Proud: A Fast Sea–Of–Gates Placement Algorithm", 25th ACM/IEEE Design Automation Conference, IEEE 1988, pp. 318–323.

Shahookar et al., "VLSI Cell Placement Techniques", ACM Computing Surveys, vol. 23, No. 2, Jun. 1991, pp. 154–220.

Gale Morrison, "Synopsys Unveils Physical Compiler", Electronic News, Nov. 15, 1999, p. 36.

* cited by examiner

DYNAMIC WEIGHTING AND/OR TARGET ZONE ANALYSIS IN TIMING DRIVEN PLACEMENT OF CELLS OF AN INTEGRATED CIRCUIT DESIGN

BACKGROUND OF THE INVENTION

1. Field of the Invention

The invention relates to the placement of functional cells during integrated circuit design, and more particularly, to the use of timing information in the course of cell placement during computer automated circuit design.

2. Description of the Related Art

There is a burgeoning demand for smaller, faster, more versatile and more powerful integrated circuits (ICs) in a wide range of fields such as computing, communications, instrumentation, and control systems, for example. Advances in semiconductor technology have made it possible to construct transistors with dimensions that are so small that a single tiny IC chip can contain upwards of millions of transistors. The tremendous complexity of ICs requires the use of automated design tools to permit circuit designers to specify circuit functionality, to place the functional cells (e.g., transistors, circuit elements, objects or logic gates) on a floorplan of an IC chip, to route interconnecting wires between the placed cells and to test the resulting design to ensure that it meets requirements such as timing constraints.

Modern circuit design has evolved into a specialized field often referred to as electronic design automation in which computers and computer aided design (CAD) techniques are used to automate the IC chip design process. Computers can be programmed to reduce or decompose large, complicated circuit designs into a multitude of much simpler circuit design components. Computers can be programmed to develop an overall circuit design through a process of iterative solution of a multiplicity of smaller design problems that relate to the circuit design components. The computers can be programmed so that the design problems that relate to the circuit design components are solved so that design constraints for the overall circuit design are satisfied and the solution of the many smaller design problems results in convergence upon an acceptable overall circuit design.

Generally, an IC circuit design process begins with an engineer specifying the input/output signals, functionality and performance characteristics of the circuit. This information is provided to a computer that runs a logic synthesis program that generates a specification defining the integrated circuit in terms of a particular technology (e.g., very large scale integration). More specifically, the specification may include a netlist that specifies the interconnection of functional cells in the circuit. The specification serves as a template for the design of a physical embodiment of the circuit in terms of transistors, routing input and output pins, wiring and other features involved in the layout of the chip. The layout is a geometric or physical description of the IC that may consist of a set of geometric shapes in several layers.

An IC chip layout is designed by providing the specification to a computer that runs computer aided design programs that determine an optimal placement of functional cells and an efficient interconnection or routing scheme between cells to achieve the specified functionality. Computer implemented placement algorithms assign locations to the functional cells so that they do not overlap, so that chip area usage is optimized and so that interconnect distances are minimized. Chip area optimization permits more functional cells to fit into a given chip area. Wire length minimization reduces capacitive delays associated with longer nets so as to speed up the operation of the chip. Routing generally follows placement. Computer implemented routing algorithms determine the physical distribution of wire interconnects through the available space.

There are a number of different procedures for achieving optimal placement. The paper entitled, "A Procedure for Placement of Standard-Cell VLSI Circuits," published in IEEE Transactions on Computer-Aided Design, Vol. CAD-4, No. 1, January 1985, by Alfred E. Dunlop and Brian W. Kernighan, proposes one such placement procedure. The method is based on graph partitioning to identify groups of modules that should be close to each other, and a technique for properly accounting for external connections at each level of partitioning.

The paper entitled, "PROUD: A Fast Sea-of-Gates Placement Algorithm," published in the $25^{th}$ ACM/IEEE Design Automation Conference (1988), Paper 22.3, by Ren-Song Tsay, Ernest S. Kuh and Chin-Ping Hsu, describes a placement process that takes advantage of the inherent scarcity in the connectivity specification of an integrated circuit design. The method solves repeatedly sparse linear equations by the successive over-relation process in a top-down hierarchy. More specifically, the technique uses a quadratic placement formulation. It takes I/O pad specification as input and solves successive linear sparse equations. It depends upon the concept of resistive network optimization.

The paper entitled, "GORDIAN: VLSI Placement by Quadratic Programming and Slicing Optimization," published in IEEE Transactions on Computer-Aided Design, Vol. 10, No. 3, March 1991, by Jurgen M. Kleinhans, Georg Sigl, Frank M. Johannes, and Kurt Antreich, describes look-ahead methods incorporated in quadratic programs to hierarchically resolve routing congestion and reduce overall design area. The acronym GORDION stands for the two main parts of the method: global optimization and rectangle dissection, which is based on improved partitioning schemes. FIG. 1, taken from the paper by Kleinhans et al., shows overall data flow in the placement procedure of GORDION. The placement problem is formulated as a sequence of quadratic programming problems derived from the entire connectivity information of the circuit. Partitioning is employed to recursively create smaller and smaller placement subproblems. An increasing number of constraints restricting freedom of movement of the cells are imposed, reflecting successively refined partitioning. In this way, at each level of refinement, a global placement of cells is obtained simultaneously for all subproblems, avoiding any dependence on processing sequence.

U.S. Pat. No. 5,267,176 entitled, Method of Placing Modules on a Carrier, which issued on Nov. 30, 1993, to Antreich et al., describes a method that employs quadratic optimization. The method involves repetition of a global placement of cells on a placement region and subsequent partitioning. The global placement and partitioning steps are repeated until every sub-region contains at most a prescribed number of cells. The global placement ensues by arranging cells in the sub-regions such that the cells assigned to the sub-regions have their centers of gravity falling onto center coordinates of these sub-regions. The arrangement of all cells in all sub-regions is thereby simultaneously calculated. The sub-regions are defined by partitioning the placement region or, respectively, sub-regions, whereby a selectable number of cells are allocated to the sub-regions defined by partitioning.

U.S. Pat. No. 5,818,729 entitled, Method and System for Placing Cells using Quadratic Placement and a Spanning Tree Model, which issued on Oct. 6, 1998 to Chi-Hung Wang and Dwight D. Hill, discloses a placement method that uses a conjugate-gradient quadratic formula based placement system (e.g., GORDION) which inputs an integrated circuit design in a netlist form and generates a connectivity matrix for each multi-pin net within the design. The GORDION placement system performs global optimization using a conjugate gradient process to minimize wire lengths of circuit elements in nets. Partitioning also is performed. The clique model of a multi-pin net is used to generate first (or initial) connectivity matrices for the multi-pin nets which run through the global connectivity process. This first run provides a rough placement of the elements of the multi-pin nets. A spanning tree process is then run on the initial rough placement data and subsequent connectivity matrices are constructed using the spanning tree model, not the clique model, for multi-pin nets of within a defined size range. A placed netlist is the end product.

Ordinarily, as a chip design is developed, it is evaluated to ensure that it will satisfy timing constraints. An engineer typically specifies timing constraints such as signal arrival times at input and output pin terminals. In the course of developing the IC chip design, an incipient design is tested using automated timing verification tools to ascertain whether or not a design is likely to meet all of the timing constraints.

For example, U.S. Pat. No. 5,841,672 entitled, Method and Apparatus for Verifying Signal Timing of Electrical Circuits, issued Nov. 24, 1998 to Spyrou et al., discloses taking into account both resistance and capacitance of an interconnect network when determining both gate delays and interconnect delays of an integrated circuit. The time required for a signal to propagate through a component such as a gate typically is referred to as gate delay. The delay associated with interconnect wires that connect one gate to another is typically referred to as interconnect delay. A gate, for example, may comprise any device for processing a signal waveform, such as a logic gate (e.g., AND gate, OR gate, NAND gate and so forth) or even a single transistor. Interconnect delay depends on the resistance and conductance of the conductive paths between gates. Interconnect delay also depends upon driving characteristics of the gate or gates which are used to drive the conductive path between gates. As used herein, driving characteristics of a gate can be considered to include the slope of a gate output signal when the gate is transitioned from one value to another (e.g., logic level "1" to logic level "0" or vice versa).

Generally, upon completion of cell placement and routing, often referred to as physical design, analyses involving RC extraction, timing and signal integrity evaluations are performed on the physical design (placed and routed design) to determine whether the specified timing constraints have been satisfied. It will be appreciated that after the placement and routing processes, an incipient physical design exists for the proposed circuit. The physical design may possess far more accurate RC delay information than the logical design used at the outset of the placement process. As a result, there frequently are significant discrepancies between the timing specified in a logical design and in the actual timing of the incipient physical design. Back-annotation often has been used to feed back more accurate RC information about the delay characteristics of critical nets to a logic optimizer or re-synthesis tool, for example, which can run another pass incorporating the new delay information. The back-annotated RC information, for example, might be used to add drivers to unexpectedly long wires or to optimize gates driving long wires or to optimize the paths that slowed them.

The gap between a logical design and physical design has become a more significant problem as circuit dimensions have reached the deep submicron level. Advances in semiconductor technology have resulted in ever-smaller dimensions of the gates and interconnect paths of integrated circuits. As gate sizes have decreased and interconnect paths have been developed with reduced cross-sectional area, the RC delay contribution of these conductive paths has become a more significant consideration in the estimation of signal delays through an integrated circuit. Traditional placement and routing tools obtain timing constraints from a logic synthesis tool. If the timing constraints are too conservative, then it can be difficult for the placement tool to determine which nets within a netlist to optimize. If the constraints are too aggressive, then it can be difficult to find non-critical nets whose performance can be sacrificed in order to improve the performance of other nets. The result in either case can be a less than optimal placement result.

Moreover, prior placement techniques often relied upon a statistical wire load model to estimate the RC delay of nets within a circuit design. In circuit designs in which the interconnect wires contribute a significant portion of the circuit delay, however, a statistical model becomes increasingly less accurate as the placement process progresses since it fails to account for more accurate RC delay information that becomes available in the course of the placement process. As a result, prior placement processes often do not lead to sufficiently accurate timing results to efficiently achieve timing convergence between logical and physical designs.

Thus, there has been a need for improvement in the placement of functional cells in integrated circuit designs. Specifically, there is a need for more efficient timing convergence between logical and physical designs in the course of cell placement. The present invention meets this need.

There is also a need for improvements in the detailed placement process that typically follows global placement. Global placement ordinarily involves an effort to place all functional cells so as to achieve a "legal" placement in which cells do not physically overlap other cells. Detailed placement involves an effort to optimize the placement result by moving cell locations in order improve circuit performance. More specifically, detailed placement may involve moving cells around a placement area in order improve routing by reducing routing congestion or to improve timing by reducing path delays. Detailed placement decisions often involve an exhaustive search for improved cell placement. Heuristics may be employed during detailed placement to evaluate whether or not a change in cell placement will result in improved performance. For example, a move that degrades local performance may nevertheless be implemented if it is likely to improve overall circuit performance. Determinations of which possible cell movements actually improve circuit performance can involve time consuming timing calculations, especially if the detailed placement involves an exhaustive search during which a multitude of possible cell movements are evaluated.

One solution to the problem of evaluating congestion or wire interconnect density during detailed placement involves the use of bounding boxes. For example, U.S. Pat. No. 5,587,923 entitled, Method for Estimating Routability and Congestion in a Cell Placement for Integrated Circuit Chip, issued Dec. 24, 1996 to Donald C. Wang, proposes estimating routing density in a placement by superimposing a pattern of contiguous tiles over the placement with each of the tiles having edges. Bounding boxes are constructed around nets respectively, and net probable densities are calculated within each bounding box for the wiring required by each net for each edge.

One solution to the problem of evaluating signal delay involves the use of slack budgets. A slack budget may prescribe the amount of delay that can be added to a net pin pair along a path in a circuit design without violating specified timing constraints for the circuit design. For instance, a user may specify a set of signal arrival times on primary input pins and corresponding output pins. The slack is the difference between the required arrival time on a primary output pin and the actual signal arrival time on the primary output pin. A positive slack time on a path, from a primary input to a primary output, signifies that the path satisfies the specified timing constraint because the timing delay on the path is less than that required by the timing constraint. A negative slack time on a path, from a primary input to a primary output, signifies that the path does not satisfy the specified timing constraint because the delay on the path is greater than the that required by the timing constraint. The merits of a proposed cell movement are evaluated based upon whether or not the move will cause a path that includes the cell to violate a slack budget constraint.

Unfortunately, there have been shortcomings with the use of slack budgets to evaluate detailed placement alternatives. For example, if the initial timing constraints are too conservative (i.e., too tight), then the detailed placement process may be overly constrained in trying alternative cell movements. On the other hand, if the timing constraints are not conservative enough, then the detailed placement process may vacillate among too many alternative cell movements without converging upon an optimal design quickly enough.

U.S. Pat. No. 5,831,863 entitled, Advanced Modular Cell Placement System with Wire Length Driven Affinity System, issued Nov. 3, 1998, to Scepanovic, et al. addresses wire length and density issues as part of the detailed placement process. A system for determining the affinity associated with the relocation of a cell located on a surface of a semiconductor chip to a different location on the surface is disclosed. Each cell may be part of a cell net containing multiple cells. The system initially defines a bounding box containing all cells in the net which includes the cell. The system then establishes a penalty vector based on the bounding box and borders of a region containing the cell, computes a normalized sum of penalties for all nets having the cell as a member, and calculates the affinity based on the normalized sum of penalties. The advanced cell placement system disclosed by Scepanovic, et al. patent aims to derive a legal placement with good wire length and density optimization. However, it does not address the timing driven placement issues.

Thus, there exists a need to improve the evaluation of how cell movements during detailed placement will affect signal delay in a circuit design. The present invention meets this need.

SUMMARY OF THE INVENTION

In one aspect, the present invention provides a novel global placement process and associated computer software for global placement of functional cells of an integrated circuit design. The global placement process is recursive and timing driven. Functional cells are placed according to how that placement is likely to influence signal timing. The global placement process is recursive. As more up to date cell placement information becomes available in the course of the global placement process, more up to date timing information is developed to guide further cell placement.

In another aspect, the present invention provides a novel detailed placement process and associated computer software for detail placement of functional cells of an integrated circuit design. Target zones are defined which provide indications of the timing impact of functional cell movement. A detailed search for improved cell placements is conducted in which target zones are used to assess the signal timing impact of proposed cell movements.

In another aspect, the present invention provides a novel process and associated computer software in which the novel global placement produces a global cell placement result, and the novel detailed placement process produces an improved detailed placement result.

DETAILED DESCRIPTION OF THE PREFERRED EMBODIMENTS

The following description is presented to enable any person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for purpose of explanation. However, one of ordinary skill in the art would realize that the invention may be practiced without the use of these specific details. In other instances, well-known structures and devices are shown in block diagram form in order not to obscure the description of the invention with unnecessary detail. Thus, the present invention is not intended to be limited to the embodiment shown, but is to be accorded the widest scope consistent with the principles and features disclosed herein.

Figure 1:
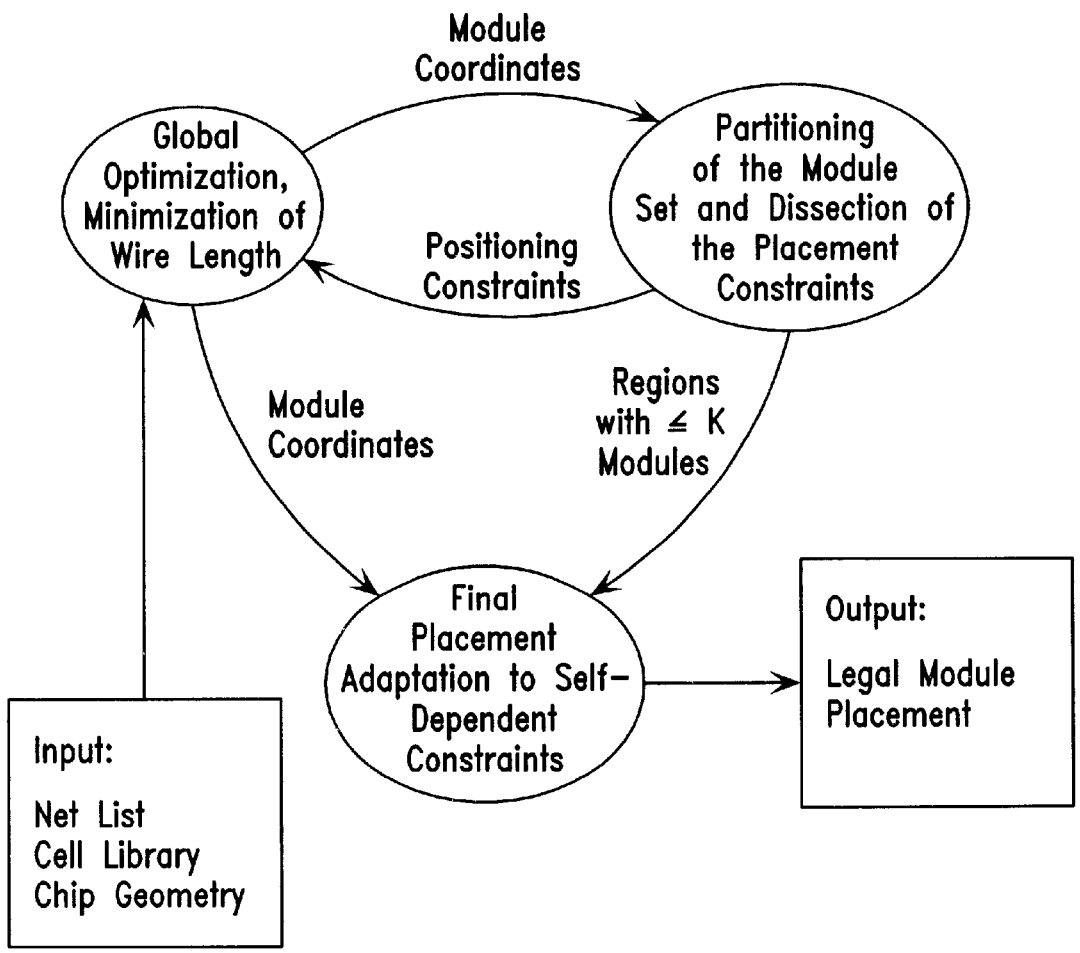
FIG. 1 is an illustrative drawing of the overall data flow in accordance with the known "GORDION" VLSI placement by quadratic programming and slicing optimization.
Figure 2:
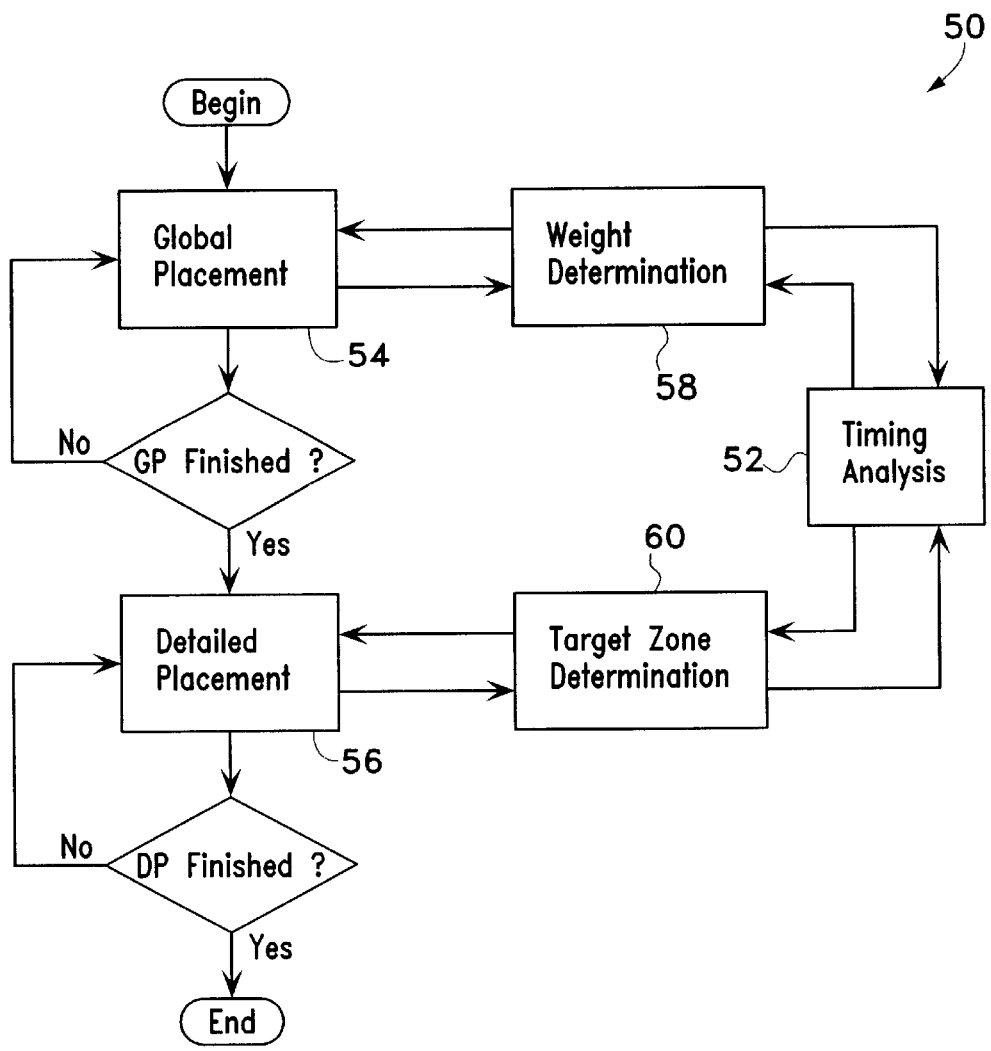
FIG. 2 is an illustrative drawing showing a generalized flow diagram of a placement process in which circuit design information from a timing analysis process guides global cell placement and detail placement of functional cells in accordance with a present embodiment of the invention.

The illustrative drawing of FIG. 2 shows a generalized flow diagram 50 of a placement process in which circuit design information from a timing analysis process 52 guides the placement of functional cells in accordance with a present embodiment of the invention. The overall placement process includes an iterative global placement process 54 and an iterative detailed placement process 56. The detailed placement process 56 receives as input the result of the global placement process and employs a heuristic algorithm to search for an optimized placement of the functional cells of the netlist. The global placement process operates on connectivity matrices that comprise weights that represent the spatial affinity among cells in respective multi-pin nets. The global placement process in accordance with the present invention dynamically adjusts at least some of the weights based upon more accurate physical cell placement information that becomes available during the global placement process. More specifically, during the global placement process, weight determination block 58 uses timing information from the timing analysis process 52 to dynamically modify weights entered in connectivity matrices as the iterative global placement process 54 progresses. During the detailed placement process, target zone block 60 creates geometric target zones used during the detailed placement process 56 to evaluate whether or not movement of a cell will degrade circuit performance.

Timing analysis information is updated as the iterative placement process 50 progresses. The use of updated timing information in the course of the iterative global placement process 54 ensures that increasingly more accurate weights can be employed in subsequent iterations as more accurate timing information becomes available as the placement process progresses. Target zones can be used during detailed placement 56 to more efficiently evaluate whether prospective cell movements will improve or degrade circuit timing performance without the need to actually calculate new circuit timing that is likely to result from such movements.

Global Placement

Figure 3:
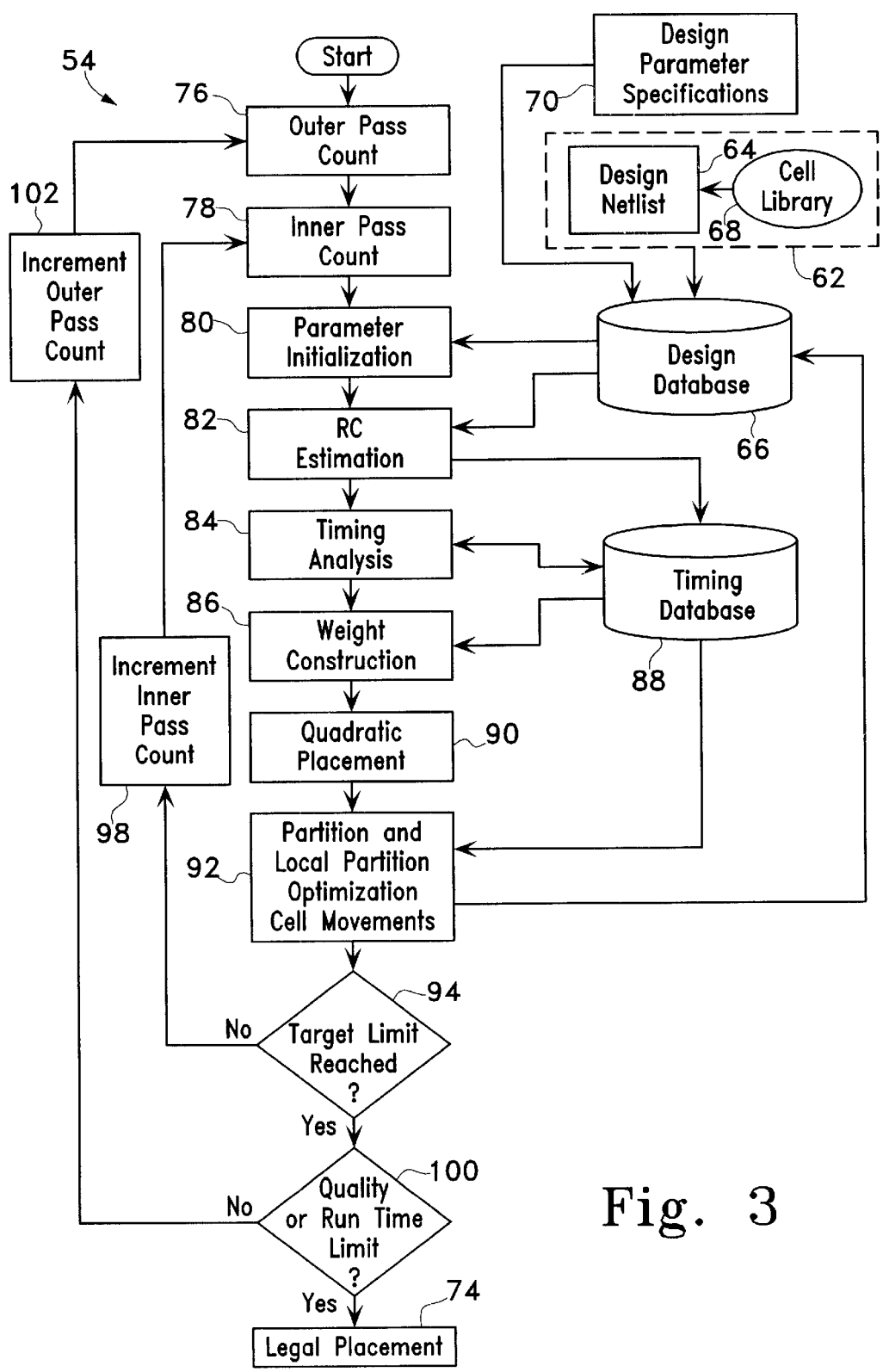
FIG. 3 is an illustrative drawing showing a flow diagram of a global placement process in accordance with a presently preferred embodiment of the invention.

The illustrative drawing of FIG. 3 provides a flow diagram of a computer controlled global placement process 54 in accordance with a presently preferred embodiment of the invention. The global placement process is implemented using computer readable program code stored in a computer readable memory. Input design block 62 represents computer software that provides an input design netlist 64 representing an unplaced integrated circuit design input to a design database 66. An extract from a cell library 68 is associated with the input design netlist 64. The dimensions of each cell as well as the location of its pins and the timing characteristics of the cell are provided by the cell library 68. The input design netlist 64 specifies functional cells and their interconnections but does not indicate their location or placement. A design parameter specification block 70 represents computer software that provides user-specified design parameters such as input/output pin locations and timing constraints such as signal arrival times on input and required arrival time on the output pins. Target die size also can be specified. Output block 74 provides the result of the global placement process which comprises a legal placement of the netlist in which no functional cell physically overlaps any other functional cell and in which each element of the design is given a proposed two dimensional (x, y) placement.

In a presently preferred embodiment of the invention, the global placement process 54 is a recursive process that employs quadratic optimization based placement to achieve legal placement of the cells in a netlist. Outer pass count block 76 and inner pass count block 78 keep track of the number of iterations. At the start of the global placement, a count in outer pass count block 76 is set initially to a starting count, and a count in the inner pass count block 78 also is set initially to a starting count. The starting count for both the inner pass count block 76 and outer pass block 78 is the number 1 (one) in a present embodiment. As explained below, the outer and inner pass count numbers are incremented (or decremented as the case may be) in the course of the global placement process. As global placement proceeds, increasingly more accurate information concerning the proposed physical placement of nets and cells of the design netlist is developed. The outer and inner pass counts provide an indication of the progress or number of recursions the global placement process and, therefore, provide an indication of a level of confidence or likelihood that the then current global placement is within an acceptable limit.

Parameter initialization block 80 represents computer software that initializes parameters at the beginning of each iteration of the global placement process using information from the design database 66. The design database 66 includes information that can be specified at the beginning of the global placement process such as: input design netlist, I/O pin locations, signal arrival times on input and required arrival times on output pins, die size, cell dimensions and cell pin locations, for example. The design database 66 is updated to also include information developed in the course of the recusive global placement process such as the proposed (x, y) placements of the cells of the initial design netlist, for instance. Consequently, parameter initialization block 80 may reinitialize certain parameters during each recursion in order to bring them in line with updates in the design database 66. For instance, partition boundary information (produced by partition block 92 described below) may be reinitialized and cell density control may be reinitialized if necessary.

Moreover, in a current embodiment, the parameter initialization block 80 defines connectivity relationships among cells. In a present embodiment of the invention, block 80 generates clique models of certain multiple pin nets of the initial design. Clique models represent connectivity relationships of the cells within individual nets. In essence, the clique models constitute information structures stored in computer readable memory that indicate which cells are to be grouped more closely together during the placement process. The cells that share a common net are represented in a common clique model. Cells in a common clique model generally will be placed close together in a circuit design.

More specifically, each pin pair in a net corresponds to an edge in a clique model. Each edge can be associated with a weight that is indicative of the spatial affinity that the pins of a pin pair corresponding to the edge have for each other. The weights are used during quadratic placement to determine which cells should be placed close together.

Figure 4:
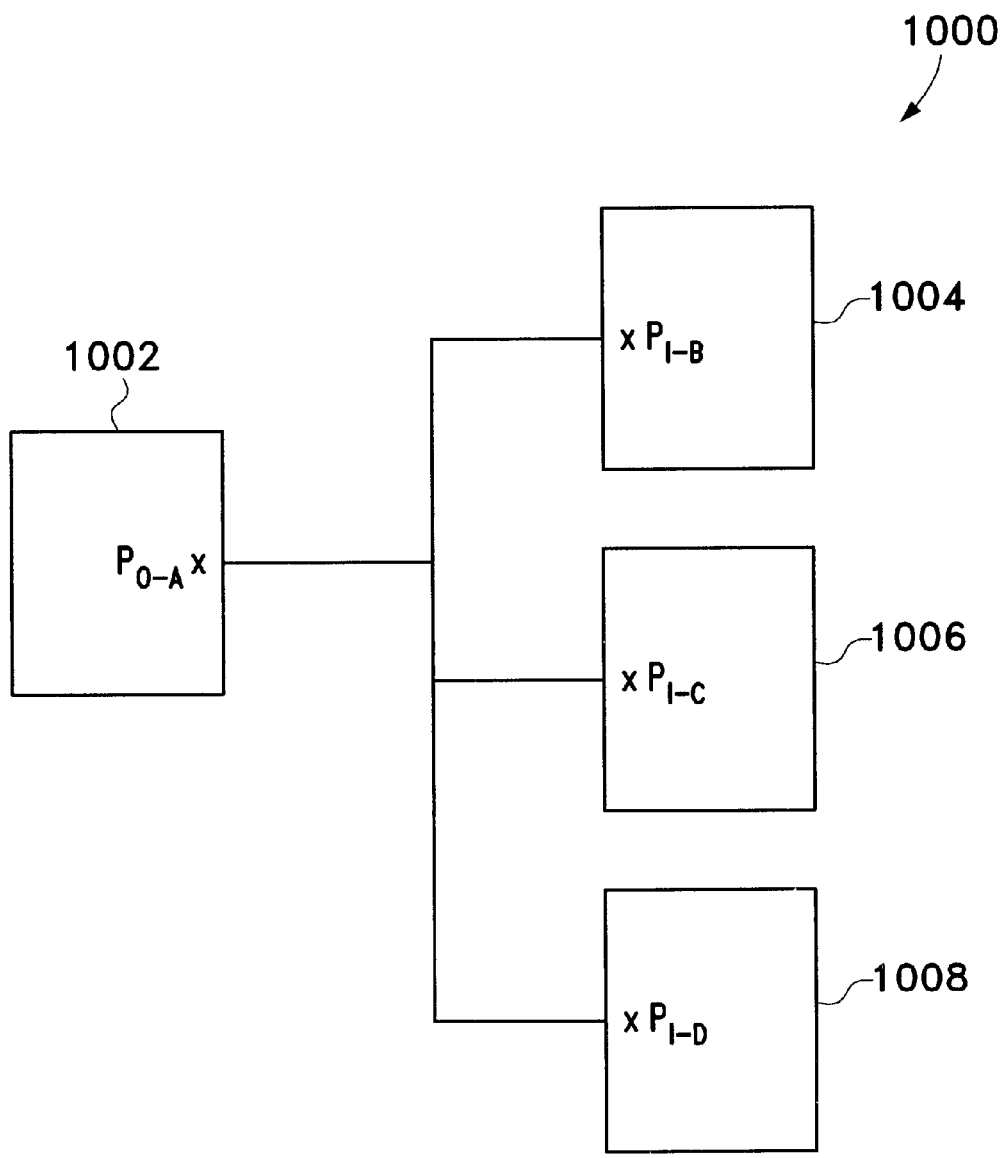
FIG. 4 is an illustrative drawing of an example of a four pin net that can be placed in accordance with the present invention.

For instance, the illustrative drawing of FIG. 4 shows an example of a four pin net 1000 comprising functional cells 1002, 1004, 1006 and 1008. Output pin $P_{O-A}$ of cell 1002 drives input pins $P_{I-B}$, $P_{I-C}$, and $P_{I-D}$ of cells 1004, 1006 and 1008 respectively. There are six weight terms associated with each pin pair of the net 1000 as follows: Wt(O-A, I-B), Wt(O-A, I-C), Wt(O-A, I-D), Wt(I-B, I-C), Wt(I-B, I-D) and Wt(I-C, I-D). If the clique model is used to represent the spatial affinity of the pins of the various pin pairs to each other, then each of these weights is likely to have a non-zero value.

One aspect of the present invention involves novel clique models. One feature of the novel clique models is that the edges associated with different pin-pairs within a single clique model may be associated with different weights. This shall be referred to as the non-uniform weight feature. For instance, if the path from $P_{O-A}$ to $P_{I-C}$ is the most critical path then the weight construction block 86 assigns a larger weight value to Wt(O-A, I-C) than to any of the other weights relating to the net 1000. Although there are no direct path connections between $P_{I-B}$ and $P_{I-C}$, for example, the weight construction block 86 assigns a weight to Wt(I-B, I-C) that is sufficiently large to cause the quadratic placement block 90 to try to pull pins $P_{I-B}$ and $P_{I-C}$ close together such that the total wire load of the net 1000 will be confined. Another feature of the novel clique models is that the associated weights may be changed in the course of the placement process as more accurate timing information is developed which provides increasingly more accurate basis for assigning weights indicative of the spatial affinity that pin pairs have for each other. This shall be referred to as the dynamic weight(ing) feature. As explained above weight construction block 86 may change the weight values as the global placement process progresses.

More specifically, in accordance with the dynamic weight (ing) feature, the weights of the clique models can be dynamically adjusted as more accurate information concerning the proposed physical placement of functional cells represented by the clique models is developed during the recursive global placement process. Basically, as more accurate proposed physical placement information becomes available during the recursive global placement process, more accurate signal timing and delay information also becomes available. This improved placement and timing information is used as the basis for dynamically adjusting the weights in a connectivity matrix during global placement.

More specifically, in a current embodiment, as more accurate placement information is developed, the weights in one or more of the clique models can be changed. These new weights are inserted into the connectivity matrix.

In a present embodiment of the invention, a connected graph model is used to represent non-critical path high pin count nets. The chain model and the spanning tree model are examples of a connected graph model. U.S. Pat. No. 5,818,729 describes an example of a spanning tree model. In a typical connected graph, each pin of a net serves as a graph node. A non-zero weight between any two pins defines an edge between them. The pin pair weights of a connected graph are constructed by weight construction block 86 based on physical information.

In a current embodiment, all pin pair weights are zero before placement begins. Those instances (function cells) connected by high pin count non-critical path nets will have their initial locations determined, or at least significantly influenced by, other low pin count nets connecting them. Cells of a high pin count non-critical path net that are within a prescribed range of each other are grouped together as a subgraph. Weights are assigned only to edges that interconnect pin pairs of such subgraphs. If there is no edge between a pin pair in a connected graph model, then there is no weight associated with that pin pair. It will be appreciated that a high pin count non-critical path net may have several subgraphs. One connection path is defined between each subgraph and another subgraph so as to, in effect, combine such interconnected subgraphs into a new subgraph that subsumes the interconnected subgraphs. This process of defining connection paths between subgraphs continues until only a single subgraph remains. This remaining subgraph constitutes the connected graph model for such a high pin count non-critical path net.

Connected graph edge weights are constructed first by assigning weights to edges with pin pairs that have distances between them within a prescribed range so as to form subgraphs. Then weights are assigned to connection paths between connected subgraphs. This approach to the formation of a connected graph confines the total wire length of high pin count non-critical path nets without disturbing critical path nets or low pin count nets too much.

The weights of the clique models, and connected graph models populate a connectivity matrix which is a data structure in computer readable memory, that is accessed by the quadratic placement block 90 which is discussed below. A nonzero weight entry is placed into a matrix entry when a connection (e.g. spatial affinity) is present between cells of a clique model, for example. Connectivity matrices are disclosed in U.S. Pat. No. 5,818,729 which is expressly incorporated herein by this reference.

Parameter initialization block 80 uses the clique model connectivity information as well as connected graph model connectivity information to produce the connectivity matrix. Weight construction block 86 populates the matrix with weights as explained below. The connectivity matrix contains both connectivity information and spatial affinity information, in the form of weights, for cells of the design. Quadrative placement block 90 accesses the connectivity matrix during placement as described below.

The initial design netlist generally does not include cell placement information. However, as the placement process progresses, increasingly more accurate (x, y) placement information is developed for the cells of the design netlist. As the iterative global placement process progresses, the parameter initialization block 80, RC estimation block 82, timing analysis block 84 and weight construction block 86 will have available to them increasingly more accurate placement and timing information that can be used to derive weights that provide improved measures of the spacial affinity between cells and timing criticality along the path.

RC delay estimation block 82 generates respective RC delay values for respective wire paths interconnecting respective cells in accordance with the following relationship.

$$RC_{(path)} = F(A) \times RC_{(predicted)} + ((1-F(A)) \times RC_{(proposed)})$$

$$F(A) = F(\text{OP Count, IP Count, design size, library statistics})$$

F(A) represents a function that varies with OP count, IP count, design size and library statistics. The OP count represents the outer pass count of block 76. The IP count represents the inner pass count of block 78. The overall design size (i.e., number of cells) of the circuit design can be ascertained from the input design netlist 62. The library statistics may include parameters such as, feature size, number of routing layer library and technology routability.

Basically, the function F(A) accounts for the state of the design process (e.g., number of recursions completed) and the physical characteristics of the design (e.g., design size and cell characteristics). The relative importance of these factors may vary from one design to the next. Therefore, it will be appreciated that F(A) depends heavily upon how the user wishes to factor together F(A)'s various constituent factors (e.g., OP Count, IP Count, design size, library statistics). Moreover, it will be appreciated that additional factors or only a subset of the indicated factors may be employed by F(A).

In essence, F(A) serves as a factor that controls the rate of change of the relative influence of $RC_{(predicted)}$ and $RC_{(proposed)}$ upon the value of $RC_{(path)}$ as the recursive placement process from one iteration to the next. Persons skilled in the art will appreciate that F(A) may be defined heuristically and may vary from one design to another. In that regard, the computer program that implements F(A) may be constructed to permit the user to define F(A).

Ideally, F(A) is defined so that as the number of global placement iterations increases as the global placement process progresses, the value of $RC_{(path)}$ will come to depend more upon the value of $RC_{(proposed)}$ and less upon the value of $RC_{(predicted)}$. In a present embodiment, a function F(A) is employed that is a monotonically decreasing function as OP count and IP count increase. In a present embodiment, the value of F(A) starts at 1 (one) during the first global placement iteration and approaches 0 (zero) in the later global placement stages.

$RC_{(predicted)}$ represents an RC value of a net predicted using statistic wire load model calculations. Wire load model calculations can be used to estimate an RC value for each net of an initial design netlist. $RC_{(proposed)}$ represents an RC value of a net calculated using RC information derived from the proposed physical placement of the net during the global placement process. The $RC_{(proposed)}$ value for a net may change as cells interconnected by the net are moved during successive global placement iterations. Basically, an $RC_{(predicted)}$ value provides a rough estimate of the RC value of a net based upon statistical information. While an $RC_{(proposed)}$ value provides an increasingly more accurate topological estimate of the RC value of a net as improved information concerning the likely pin locations of the net is developed during the global placement process.

In a present embodiment of the invention, $RC_{(predicted)}$ values are produced based upon a well known statistical wire load model. The term "predicted" is used here because these RC values are not produced based upon actual placement results. The predicted resistances (R) and capacitances (C) in a statistic wire load model typically depend on factors such as the net pin count and design size. In one embodiment, a circuit designer can define a mapping table that maps R and C values to net pin count and design size.

For instance a two-pin net in a 10,000-gate design is likely to have a predicted RC value that will be different from a predicted RC value of a two-pin net in a 50,000-gate design. In other words, nets with different numbers of pins (e.g., two, three, four, five, etc.) in different size designs (e.g., 10,000 gates, 50,000 gates, 100,000 gates, etc.) will have different predicted RC values. Predicted RC values for different net sizes in different design sizes can be stored in lookup tables, for example. Predicted RC values for paths between any two cells can be retrieved from lookup tables that can be generated based upon a statistical wire load model.

In a current embodiment of the invention, $RC_{(proposed)}$ values are produced based upon a lumped RC model, also called the Elmore delay model. See, W. C. Elmore, "The Transient Response of Damped Linear Networks with Particular Regard to Wire-Band Amplifiers," Journal of Applied Physics, Vol. 19, No. 1, January 1948, pages 55–63. Also see, Rubinstein et al., "Signal Delay in RC Tree Networks," IEEE Transactions in Computer-Aided Design, Vol. CAD-2, No. 3, July 1983, pages 202–211. In a lumped RC model, the propagation delay along a path from a start point to an end point Tp(start, end), is computed as a product of lumping all of the resistances Rj and capacitances Ck along the path, that is, $$Tp(\text{start, end}) = \Sigma Rj \times \Sigma Ck.$$

High-Level Synthesis, Introduction to Chip and System Design, at section 3.4.1, pages 78–79, describes the use of lumped RC and is expressly incorporated herein by this reference. The term "physical" is used here because the RC values are produced based upon proposed or intermediate cell placement results developed as the global placement process proceeds from one iteration to the next. A lumped RC model can be used to produce estimated physical RC delay values for paths between cells based upon proposed cell placement and the geometry (length and width) of the wires interconnecting the cells.

Thus, both an $RC_{(predicted)}$ value and an $RC_{(proposed)}$ value can be produced for a wire path interconnecting any two given cells. It will be appreciated that $RC_{(proposed)}$ values may change as more placement iterations occur. However, an $RC_{(predicted)}$ value remains constant. An $RC_{(path)}$ can be calculated using the above relationships. The function F(A) described above causes respective $RC_{(path)}$ values to depend more heavily on respective $RC_{(predicted)}$ values during the initial global placement iterations when little physical placement information has been produced. The function F(A) causes respective $RC_{(path)}$ values to depend more heavily on respective $RC_{(proposed)}$ values during subsequent global placement iterations when more physical placement information has been produced. As the global placement process continues, the $RC_{(path)}$ delay information becomes more and more indicative of the RC delays resulting from the proposed physical cell placement developed through the global placement process and less from statistically predicated RC delays.

As explained above, the function F(A) may be heavily dependent upon the physical characteristics of library (i.e., library statistics), for example. Thus, no precise definition of F(A) can be provided that covers all cases. One skilled in the art will appreciate that F(A) for a particular design depends upon and can be defined in terms of "heuristics" of the design process. However, the following is one simple example, of one possible definition of F(A).

$$F(A) = \frac{(\text{maximum IP Count}) - (\text{current IP Count})}{(\text{maximum IP Count})}$$

Moreover, the selection of F(A) may be depend upon the desired rate of design convergence. In the above example definition of F(A), there is a linear relationship between F(A) and IP Count. If a faster rate of convergence was desired then a quadratic relationship might be used instead to represent F(A).

Thus, it will be understood that the above definition of F(A) is illustrative only and its intended to provide the reader with an understanding of how one skilled in the art might choose to define F(A), which as explained above, may vary from one design to the next.

The output of the RC estimation block 82, therefore, includes $RC_{(path)}$ delay information for each path between cells. Block 82 provides the $RC_{(path)}$ delay information to a timing database 88 which stores the values for use during the timing analysis process.

Timing analysis block 84 obtains $RC_{(path)}$ values from the timing database 88 and uses this information together with design-specific information such as gate intrinsic delay, to identify critical path nets and to provide measurements of slack. Each circuit within an overall integrated circuit design includes one or more components such as logic gates or transistors, for example. The delay of a given circuit is the propagation delay on the critical path through the given circuit, that is, the longest delay from any input to any output of the given circuit. There may exist many critical paths in a circuit design. Each path may have a different slack value. An object of placement optimization is to reduce the maximum negative slack such that all of the critical path slack values are under a maximum prescribed propagation delay. The delay on a path from an input pin to an output pin is the sum of the propagation delays of all components and all nets on the path. An explanation of timing analysis is provided in High-Level Synthesis, Introduction to Chip and System Design, at sections 3.4.2–3.4.3, pages 79–83, which is expressly incorporated herein.

Timing analysis bock 84 estimates actual signal arrival times. More specifically, as explained above, a user may specify a signal arrival time on an input pin and corresponding signal arrival time on a corresponding output pin. The difference between the specified arrival times on the corresponding input and output pins represents a specified delay for a path interconnecting such pins. The timing analysis block 84 estimates the path delay between corresponding input and output pins at a given iteration of the global placement process. Every iteration may result in a different and, ideally, more accurate proposed physical placement of the cells of the overall circuit. Hence, each iteration results in progressively more accurate path delay information. Accordingly, critical path information becomes progressively more accurate.

Slack is a measure of the difference between required arrival time and actual arrival time for corresponding output pins. A positive slack measurement for a path indicates that a signal propagates along the path faster than specified. A negative slack measurement indicates that the signal propagates along the path more slowly than specified.

An objective of the global placement process is to eliminate, or to at least minimize, negative slack. During global placement, the placements of cells on paths with negative slack are adjusted in an effort to increase slack for those paths, sometimes at the expense of increased delay in other paths. In other words, the placement of some cells on paths with positive slack may be adjusted in order to make room for a new placement of cells on paths with negative slack.

The timing analysis block 84 reports timing analysis results for the paths to the timing database 88. Weight construction block 86 accesses the timing data base 88 and retrieves timing information used to derive weights for pin pairs of a net. More specifically, weight construction block 86 obtains slack information from timing database 88 and uses this information to determine weight values to be employed in the information structures, such as clique models in a present embodiment, used to indicate the spatial affinity of cells of nets in the circuit design. The slack time associated with a given net by the timing analysis block 84 is an important factor in the selection of the weights corresponding to the paths that comprise the given net.

The weight construction block 86 comprises computer software that computes the weight for a path between pin pair $P_j$ and $P_k$ that represent points on a path $P_{j,k}$ interconnecting two functional cells. In a current embodiment of the invention, the weight to be inserted into a clique model entry representing path $P_{j,k}$ is determined by the following relationship.

$$Wt_{j,k} = F(Wh_{jk}, Ch_{jk}, Cc_{jk})$$

$Wh_{jk}$ represents the weight history of the path between $P_j$ and $P_k$. For instance, $Wh_{jk}$ can be a real number indicative of the rate of weight change up to now. For example, $Wh_{jk}$ with a value of 1.20 may indicate that $Wt_{jk}$ has increased by 20%.

$Ch_{jk}$ represents the criticality history of the path between $P_j$ and $P_k$. $Ch_{jk}$ can be represented as a real number. For instance $Ch_{jk}$ with a value of 0.90 when $Wh_{jk}$ has a value of 1.20 may indicate that the criticality of the path between $P_j$ and $P_k$ has decreased 10% during the same interval that the weight associated with the path has increased by 20%.

$Cc_{jk}$ represents the current criticality of the path between $P_j$ and $P_k$. In a present embodiment, $Cc_{jk}$ is determined from the following relationship.

$$Cc_{jk} = ((1 - F(A)) \times C_{jk(proposed)} + F(A) \times C_{jk(predicted)})$$

In one embodiment $Wt_{jk}$ is determined as follows, $$Wt_{jk} = Cc_{jk} \times Ch_{jk} \text{ if } Ch_{jk} \leq 1, \text{ and } Wt_{jk} = Cc_{jk} \times Max(Wh_{jk}, Ch_{jk}) \text{ if } Ch_{jk} > 1.$$

The criticality of a path depends upon the timing delay associated with the path. The timing delay associated with a path depends upon the difference between the specified or required arrival time of signals traversing the path and the actual arrival time of signals traversing the path. The RC value associated with a path is indicative of the signal delay associated with the path. The estimated actual signal arrival time for a path can be determined based upon the RC timing delay associated with the path. The difference between the actual signal arrival time and the user specified or required signal arrival time is used to derive the slack associated with the path. The criticality of a path is determined based upon the slack for the path.

More particularly, slack is a metric that is indicative of the difference between the actual signal arrival time and the required signal arrival time. In a present embodiment of the invention, a positive slack for a path indicates that the actual signal arrival time for the path meets or exceeds the timing requirements for the path. In other words, a signal traversing the path will arrive at or before the required arrival time specified by the user. A negative slack for a path indicates that the actual signal arrival time for the path does not meet the timing requirements for the path. In other words, a signal traversing the path will arrive after or later than the required arrival time specified by the user.

Slack values can be derived by timing analysis block 84 for the paths in a circuit design based upon $RC_{(path)}$ values as described above. In a present embodiment of the invention, $RC_{(path)}$ values are determined by block 82.

In a present embodiment of the invention, path criticality is assigned based upon slack statistics. For instance, in one hypothetical example approach to assigning criticality, assuming that 10% of the path slack values are between −5 and −4, a path with a slack value of −5 is assigned a criticality of 1.0, and a path with a slack less that 5 and greater than or equal to 4 is assigned a criticality of 0.9. Assuming 20% of the path slack values are between −3 and −4, a path with a slack value greater than −4 and less than or equal to −3 is assigned a criticality of 0.8. Assuming 10% of the path slack values are between −2 and −3, a path with a slack value greater than −3 and less than or equal to −2 is assigned a criticality of 0.65. Assuming 10% of the path slack values are between −1 and −2, a path with a slack value greater than −2 and less than or equal to −1 is assigned a criticality of 0.30. Assuming 10% of the path slack values are between 0 and −1, a path with a slack value greater than −1 and less than 0 is assigned a criticality of 0.20. Paths with a slack value of 0 or below are assigned a criticality of 0.

For example, in another hypothetical example approach to assigning criticality, the 1% of paths with the highest magnitude negative slack are assigned a criticality of 1.0. The 1% of paths with the next highest magnitude of negative slack are assigned a criticality of 0.99. The 1% of paths with the next highest magnitude of negative slack are assigned a criticality of 0.98. This pattern progresses until all paths in the top 50% magnitude negative slack have had criticality values assigned. The remaining paths, including all paths with a positive slack, have a criticality of 0 assigned to them.

The path criticality associated with proposed physical cell placement is updated as proposed physical cell placements change in the course of the global placement process. Path criticality changes with corresponding changes in $RC_{(path)}$, and $RC_{(path)}$ may change for any given path in the course of the global placement process. As a result, a path segment that at one point in the global placement process is on a critical path may at another point be on a noncritical path. Accordingly, the slack associated with a path may vary during the global placement process. The transition of a path between critical and noncritical status and changes in slack may go in either direction. That is, in the course of the global placement process, a noncritical path temporarily may become critical with a corresponding increase in positive slack, and a critical path may become noncritical with a corresponding decrease in positive slack. The desired overall result of the global placement process, however, is to convert all critical paths into noncritical paths and correspondingly, to minimize the magnitude of negative slack.

The above approaches to the assignment of path criticality represent just two examples. Persons skilled in the art will appreciate that there are many possible approaches to the determination of path criticality. In fact, the manner in which criticality is measured may vary depending upon the nature of the circuit design. Persons skilled in the art will understand that it is important to develop an approach to the determination of path criticality that achieves the best global placement results in view of factors such as design size and the cell library, for example.

It will be understood that the forgoing relationships between $RC_{(path)}$, path criticality and path weight represent just one possible approach to determining the dynamically adjusted weights associated with paths. It is significant that the weight $Wt_{jk}$ depends upon the criticality of a path's delay to the circuit's achieving timing requirements. Moreover, it is important that the determination of path criticality depends increasingly upon $C_{jk(proposed)}$ and less upon $C_{jk(predicted)}$ as additional placement iterations take place. However, it will be understood that additional factors may be employed to compute $Wt_{jk}$ depending upon the manner in which the value of the weight $Wt_{jk}$ is to be scaled in relation to the criticality of the path.

$C_{j,k(proposed)}$ represents a determination of the criticality of the path $P_{j,k}$ based upon a proposed physical placement of cells. The value of $C_{jk(proposed)}$ is determined by the timing analysis block 84. $C_{j,k(proposed)}$ is determined based upon the slack calculated for the path $P_{j,k}$ for the proposed physical placement. Paths that have a greater magnitude negative slack generally are more critical. The value of $C_{j,k(proposed)}$ may change during the global optimization process as different cell placements are proposed from one iteration to the next.

$C_{j,k(predicted)}$ represents an estimation of the criticality of the path $P_{j,k}$ by the timing analysis block 84 using a statistical model.

Therefore, in a present embodiment of the invention, the value of the current criticality $Cc_{jk}$ is determined from a composite of a proposed physical cell placement measure of criticality $C_{j,k(proposed)}$ and a statistical model measure of criticality $C_{j,k(predicted)}$. As the global placement process progresses, and additional placement iterations occur, the function F(A) causes the criticality measure $C_{j,k(proposed)}$ gradually become a more dominant factor in determining the value of $Cc_{jk}$ than the value Of $C_{j,k(predicted)}$. Thus, as the global placement process progresses, the weight values in the clique models and connected graph models of nets may be changed to more accurately reflect the proposed incipient physical placement of cells in the circuit design.

It will be appreciated that weights are determined for individual pin pairs ($P_j$, $P_k$). Thus, the weights within a clique model subjected to such weight adjustment may become non-uniform. That is, a single clique model may include two or more different weights. Furthermore, it will be understood that the weights can be dynamically adjusted. That is, the weights within dynamically weighted clique models may be changed in the course of the global placement process, depending upon proposed changes in the placement of clique model pin pairs (e.g., $P_j$ and $P_k$) during the placement process.

The quadratic placement block 90 populates the connectivity matrix with the weights produced by the weight construction block 86 using the non-uniform, dynamically weighted clique models, uniform clique models and the connected graph models. The quadratic placement block 90 operates on the connectivity matrix to produce a placement of cells of the initial design netlist. The placement block seeks to minimize a cost function that is determined from the weights in the connectivity matrix. The cost function is of the general type that can be represented by the following relationship.

$$\text{COST}=\Sigma Wt_{j,k}|x_j-x_k|+\Sigma Wt_{j,k}|y_j-y_k|$$

Thus, the cost function that guides the placement process takes into account a weight associated with a path interconnecting any two given cells j and k and the distance between those cells. It will be appreciated that the weights for at least some of the nets of the design netlist may be adjusted as the global placement process iterates through more passes and as more accurate timing information becomes available. Therefore, the quadratic placement block 90 will be guided by increasingly more accurate cost information as the number of global placement iterations increases.

Partition block 92 divides the design circuit into subcircuits. A present embodiment of the partition block 92 employs a so-called Min-cut and density balance partition algorithm in which, over the course of several iterations of the global placement process, the design circuit is repeatedly partitioned into progressively smaller subcircuits such that the number of nets cut by the partitions is minimized and the cell density is optimized. K. Shahookar and P. Mazumder, "VLSI Placement Techniques," ACM Computing Surveys, Vol. 23, No. 2, June 1991, section 3, pages 171–181 describe partition techniques. The partitioning process groups cells into partitioned regions. C. M. Fiduccia and R. M. Mattheyes, "A Linear-Time Heuristic for Improving Network Partitions," Proceedings of the ACM/IEEE Design Automation Conference, 1982, pages 175–181, disclose a partition process that divides a design circuit into clusters such that the number of intercluster connections is minimized. Cells remain in their partitioned regions during the next execution of the quadratic placement block 90. The partitioning process, therefore, progressively restricts the freedom of movement of cells in the course of the global placement process.

Partition block 92 moves the cells within local partition regions so as to achieve an improved balance in the spatial distribution of cells in adjacent regions. A present embodiment of the partition block 92 determines whether there are more cells in a given partition region or in an adjacent partition region. Cells in the partition region with the larger number of cells are moved adjacent to the cut line between the two regions. The partition block receives timing information from the timing database 88 which is used to decide upon cell movements. More particularly, the database 88 provides slack information to the partition block 92. Moreover, the partition block may factor in congestion information to decide cell movement. It will be appreciated that minimizing congestion is a separate topic that is not the subject of the present invention and shall not be discussed in detail herein. In this manner, a more balanced distribution of cells in different partition regions of the circuit design gradually develops as the global placement process progresses.

Partition block 92 sends revised updated (x,y) proposed physical placement information for the cells of the design net list to the design database 66. This updated physical placement information can be used to produce updated timing information which can be used during subsequent global placement iterations to update the connectivity matrix weights used by the quadratric placement block 90. The updated physical placement information leads to improved quadrative placement.

More specifically, the updated proposed (x, y) placement information can be used by RC estimation block 82 to produce revised $RC_{(proposed)}$ values. The RC estimation block also generates revised $RC_{(path)}$ values as described above. The timing analysis block 84 uses the revised $RC_{(path)}$ values to compute revised slack values. The weight construction block 86 determines revised weights for the dynamically weighted portions of the connectivity matrix. As explained above, in a present embodiment, portions of the connectivity matrix may have their weights changed dynamically from one iteration to the next if they correspond to clique models disposed along a critical path of the circuit design. Thus, as the recursive global placement process progresses, new proposed (x, y) placement information is used to produce new RC delay information (e.g., $RC_{(path)}$) which is used to produce new signal timing information (e.g., slack) which is used to produce new path criticality information which is used to update the weight values which are inserted in the connectivity matrix and will be used to drive the next iteration of the placement process.

Target region limit determination block 94 determines whether target partition region size and/or cell density established by the parameter initialization block 80 has been met. If the partition region size or cell count is not satisfied, then processing flows to inner pass increment block 98. If the partition region size or cell count is satisfied, then processing flows to quality evaluation/run time limit determination block 100.

Quality evaluation block 100 ascertains whether the user requirement in timing has been met. Also, the quality evaluation block may have a limit imposed such as a total elapsed time during which the global placement process has been in operation. If the block 100 determines that the timing quality or run time limits have not been reached, then the global placement process proceeds to outer pass increment block 102. If the block 100 determines that the quality requirements have been met or a total elapsed time has been reached, then the global placement process terminates by outputting a proposed legal global placement 74 of the design netlist. The global placement result 74 is referred to as "legal" because cells do not physically overlap each other. That is, no two cells occupy the same physical space in the proposed placement.

The inner pass increment block 98 keeps track of the inner pass count (IP). The outer pass increment block 102 keeps track of the outer pass count (OP). The IP and OP will control the weighting construction and the partition optimization in accordance with F(A) and g(B) as explained above.

Detailed Placement

Figure 5:
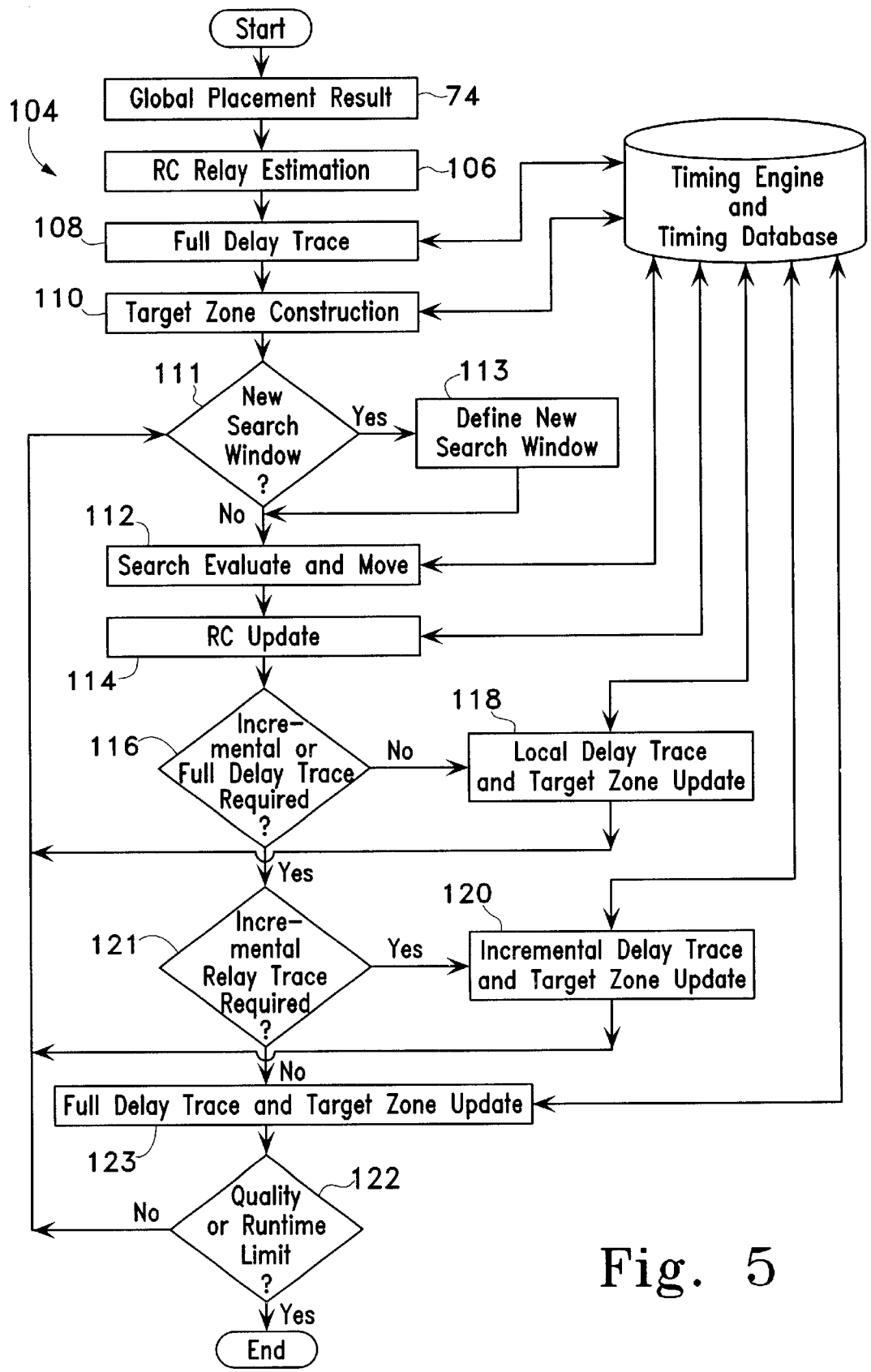
FIG. 5 is an illustrative drawing showing a flow diagram of a detailed placement process in accordance with a presently preferred embodiment of the invention.

The illustrative drawing of FIG. 5 provides a flow diagram of a computer controlled detailed placement process 104 in accordance with a presently preferred embodiment of the invention. The detailed placement process is implemented using computer readable program code stored in a computer readable memory. The input to the detail placement process 104 comprises the global placement results 74 that are the output of the global placement process 54. The global placement results include the initial design netlist plus proposed (x, y) placement locations for the cells of the netlist. The detailed placement process 104 described herein seeks to optimize the placement results based upon signal timing specifications. It will be appreciated that there are other factors that may be considered during the detailed placement process such as routabilty and wire length. However, the evaluation of those other factors is known to those skilled in the art is and is not a part of the present invention.

The detailed placement process involves a search for cell placements that will result in improved timing performance. In a present embodiment of the invention, the search strategy involves identifying nets or cells to consider as candidates for placement in other locations. Specifically, a search window is identified. A search window corresponds to a prescribed area of a carrier on which the circuit design is to be placed or to a collection of placement locations to which a cell may be moved or in which cells may have their locations swapped with other cells. For instance, a very simple search window might be a rectangular box shaped region. Cell movements are evaluated and performed within search windows. Several different search windows corresponding to different carrier portions or different circuit design placement regions may be defined in the course of the detailed placement process. A rigorous search for proposed cell placements is implemented within each window. Cells are moved during the detailed placement process in an effort to satisfy circuit timing requirements that have not been met through the global placement process.

It will be appreciated that the use of search windows to constrain a rigorous search for improved cell placement is well known and is not in and of itself the invention. As explained more fully below, the present invention involves the use of target zones to evaluate cell movement options within a given search window.

RC delay estimation block 106 represents computer software that generates respective RC delay values for the paths of a respective wire tree interconnecting respective cells that have been placed during the global placement process. RC delay is an important factor in the signal timing in a circuit. The RC delay estimation block 106 produces estimated RC values for paths in a circuit design based upon the proposed physical (x, y) cell placements developed from the global placement process of FIG. 3. In a present embodiment, a lumped RC model is used by block 106 to compute the RC values. The RC delay estimates are provided to the timing database 88.

Full delay trace block 108 uses information from timing database 88 to perform a delay analysis. A full delay trace uses the user's timing constraints, the timing model, library information (both logical and physical) and the RC estimation developed by block 106 to calculate the delay of all paths in the design and to calculate slack information. The full delay trace block 108 uses the slack information to identify critical paths for paths within the circuit design.

Target zone construction block 110 first defines candidate zones that are associated with pins of a cell that can be used to evaluate proposed movements of that cell during the detailed placement process. A cell with multiple pins may or may not have multiple candidate zones. The candidate zones of the pin(s) of a cell determine the target zone of that cell. In a present embodiment of the invention, a respective candidate zone is defined for each respective pin disposed on a critical path.

Basically, a candidate zone of a pin represents a chip design area that encompasses the pin and that provides an indication of how movement of the pin will influence signal timing. A determination of the metes and bounds of a candidate zone depends, at least in part, upon total net load and pin pair interconnect delay. In a current embodiment of the invention, a respective candidate zone for a respective critical path pin is determined using both total net load of the net that includes the pin and the respective pin pair interconnect delay associated with the respective pin. Both the total net loading and pin pair interconnect delay influence signal timing. Interconnect delay is the delay associated with transmission of a signal through a wire connection between a pin pair. Total net load represents the lumped capacitance of an interconnection wire. Thus, a candidate zone provides an indication of how movement of the pin will affect signal timing in the circuit design.

Figure 6:
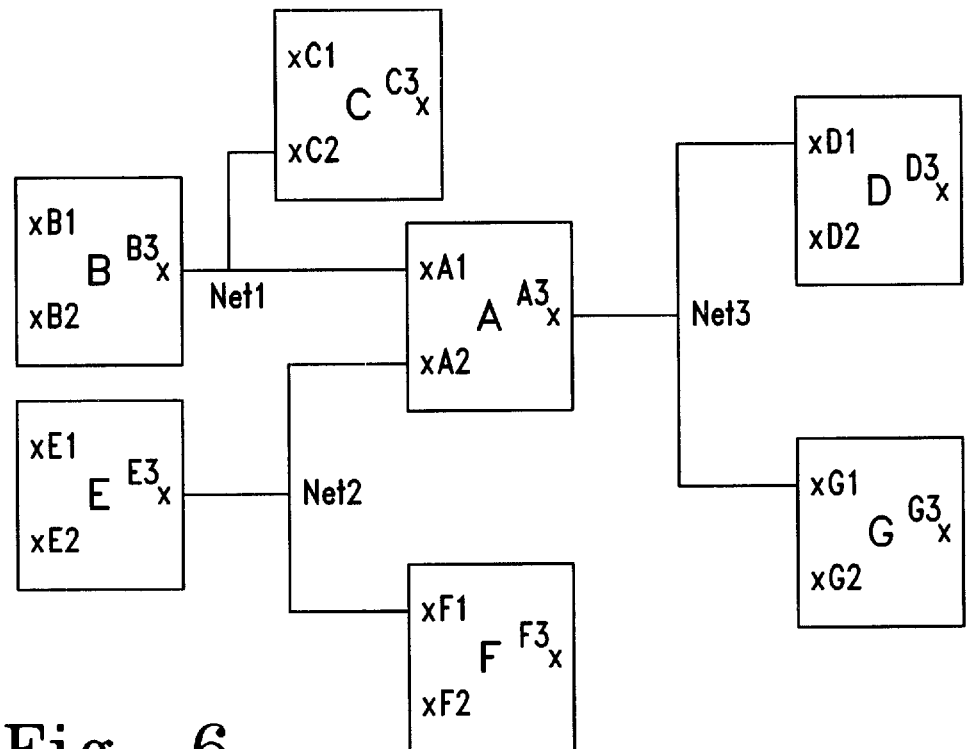
FIG. 6 is an illustrative drawing of an example of a placement of several cells of several nets that can be subjected to detailed placement in accordance with the invention.

Referring to the illustrative circuit diagram of FIG. 6, there is shown an example of the placement of several illustrative nets and several illustrative functional cells interconnected by the nets. The illustrated example cells can be swapped and moved pursuant to a detailed placement process of the present invention. Three nets net 1, net 2 and net 3 interconnect the pins of seven cells, A, B, C, D, E, F and G. Net 1 interconnects pins B3, C2 and A1 of cells B, C and A. Net 2 interconnects pins A2, E3 and F1 of cells A, E and F. Net 3 interconnects pins A3, D1 and G1 of cells A, D and G.

In accordance with a detailed placement process of the present invention, a candidate zone can be defined by block 110 for each critical path pin of a cell. A pin is a critical path pin if it is disposed on a critical path of a net. The intersection of the candidate zones of the pins of a cell defines a target zone for the cell. For example, assuming that each of the three pins of cell A lies on a critical path of a net, three candidate zones would be defined for cell A, one for each of the three pins, A1, A2 and A3 of cell A. The target zone of cell A would be defined by the intersection of the candidate zones of pins A1, A2 and A3. Alternatively, if only one of the pins, pin A1 for instance, is a critical path pin then the candidate zone for pin A1 would be the target zone for cell A. As yet another alternative, if none of the pins of cell A fell on the critical path of a net, then there would be no candidate zone and no target zone for cell A. If that was the case, then cell A could be moved about more freely within the search window.

The target zone of a cell provides an indication of how proposed movements of a cell during detailed placement will influence timing performance of the circuit. For instance, movement of a cell from one location within its target zone to another location within its target zone will not appreciably degrade circuit timing performance. Movement of a cell from a location inside its target zone to a location outside its target zone will degrade circuit performance in view of timing requirements. Movement of a cell from a location outside its target zone to a location inside its target zone will improve circuit performance relative to timing requirements. The target zone's indication of change in timing performance likely to result from a proposed cell movement can be used to determine the timing impact of a proposed cell swap or other movement of the cell during detailed placement. This indication is used by block 112 to decide whether or not to implement a proposed cell movement in the design.

Figure 7:
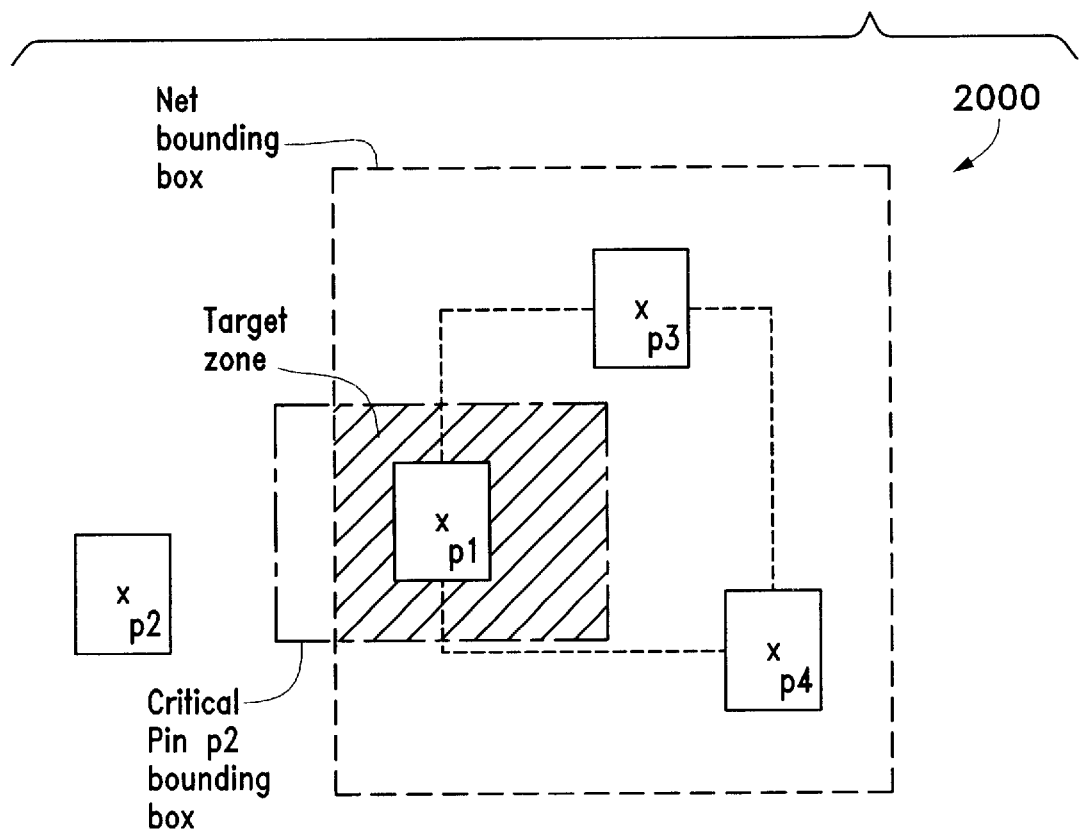
FIG. 7 is an illustrative drawing showing a determination of a target zone for a critical path pin of an example net in accordance with a present embodiment of the invention.

Referring to the illustrative drawing of FIG. 7, there is shown on illustrative circuit diagram of an example net 2000 which interconnects four pins, p1, p2, p3 and p4. Pin p1 is the output pin of net 2000. Pins p2, p3 and p4 are the input pins of net 2000. Assume that the pin pair (p1, p2) is on a critical path as determined by the full delay trace block 108. Thus, pins p1 and p2 are a critical path pins. Of course, pins p1 and p2 are associated with different cells (not shown).

Block 110 defines a target zone (if one exists) for the cell of which p2 is a constituent part. Block 110 determines a cell's pins' candidate zones in order to define the cell's target zone. The target zone for pin p2's cell is defined based upon the candidate zones of that cell's pins. Specifically, the target zone of p2's cell is defined as the region in which that cell's candidate zones overlap.

A determination by block 110 of the candidate zone for pin p2 is influenced by total net loading delay between the cell's pins of pin pair overlap (P1, P2) and by allowable critical path interconnect delay. The placement locations of the other pins of the net, pins p1, p3 and p4 are assumed by block 110 to be temporarily fixed. The total delay between a pin pair in a present embodiment is the sum of cell intrinsic delay (i.e., delay through the cells of which the pins of the pin pair are constituents), interconnect delay and load delay. Interconnect delay is the delay associated with transmission of a signal through a wire interconnecting the pins of the pair. Interconnect delay increases with longer wire distances. Load delay is some proportion of the total net loading that is associated with the pin pair. In general, the more spread apart the pins of a net, the larger the net loading. Cell intrinsic delay is constant, but interconnect delay and load delay vary with cell placement.

The timing engine and timing database 88 uses a timing budget for the pin pair path (p1, p2) to determine a desired limit of the total delay that can be associated with the pin pair. The total limit is derived from a limit on interconnect delay and a limit on total net loading. The candidate zone for pin p2 is defined so as to confine p2 to a geometric area of the circuit design that is likely to result in a placement of p2 in a location that will result in signal timing that meets design requirements.

More specifically, the timing engine and timing database 88 determines an upper bound on total net load for net 2000. It will be appreciated that net loading within a bounding box depends upon both the number of pins and bounding box size. The illustrative net bounding box for pin p2 shown in FIG. 7 is defined by block 110 for the other pins of net 2000, pins p1, p3 and p4, such that the total net load within such defined net bounding box imparts a delay within a prescribed range. Note that the location of pin p2 shown in FIG. 7 is merely illustrative. The role of the candidate zones is to define timing impact of different possible pin p2 locations. The timing engine and timing database 88 also determines a limit of allowable interconnect delay between pins p1 and p2 which are disposed on a critical path. This limit defines an illustrative interconnect delay bounding box as shown in FIG. 7. The net bounding box size and the interconnect delay bounding box size for pin p2 are determined based upon the slack budget for the critical path that pin p2 is disposed upon. One skilled in the art will understand that the net bounding box size and the interconnect delay bounding box size are determined so that the candidate zone defined by their intersection defines a placement region within which the placement of pin p2 is most likely to satisfy the slack budget. The candidate zone for pin p2 is represented by the shaded region of FIG. 7 which is the intersection of the net bounding box and the critical pin p2 bounding box. Note that if pin p2 is the only critical path pin of the cell (not shown) that includes p2 then the candidate zone of p2 also is the target zone of the cell that includes p2.

More specifically, target zone construction block 110 will allocate a critical path's slack along the critical path. In the example of FIG. 7, the slack allocated to the portion of the critical path traversing net 2000 is used to determine the target zone for pin p2 as described below. More specifically, in a present embodiment, block 110 distributes negative slack to respective (pin pair) path segments along a given critical path based upon respective load sensitivities of the respective nets to which respective path segments belong. A larger magnitude negative slack is allocated to path segments of nets with higher load sensitivities. The notion of a higher or lower net load sensitivity is relative. A net has a higher load sensitivity if changes in path segment length or in overall net area has a relatively larger impact upon signal timing. A net has a lower load sensitivity if changes in path segment length or in net area have relatively lesser impact on signal timing.

Target zone construction block 110 produces candidate zones for each critical path pin of each functional cell in the design netlist result 74. The target zone of a cell is defined as the intersection of all candidate zones of the cell. In a present embodiment, the pin candidate zone is polygonal in shape. More specifically, in a presently preferred embodiment of the invention, the pin candidate zones are defined as convex polygons with vertical edges, horizontal edges and edges at forty-five degree angles between the vertical and the horizontal edges. An advantage of the use of convex polygonal candidate zones with vertical, horizontal and forty-five degree angle edges is that the mathematical computations involved in determining whether a new cell location falls inside or outside a target zone defined by the intersection of candidate zones can be relatively simple. As a result, a calculation to determine whether a location is within or outside a candidate zone can be completed relatively quickly. For example, these calculations might involve simple inequalities, depending upon the geometry of the target zone and the direction of the proposed cell movement, such as, $x \leq a_1$, $x \geq a_2$, $y \geq b_1$, $y \geq b_2$, $x+y \leq c_1$, $x+y \leq c_2$, $x-y \leq d_1$, $x-y \geq d_2$.

Search window block 113 defines a search window size and geometry within which a rigorous search for improved cell placement is conducted. Cells within the Search window are considered for movement to a new placement within the search window. The search window block 113 may change or redefine the search window from one iteration through the detailed placement control loop (blocks 111–122) to the next.

Search, evaluate and move block 112 conducts a rigorous search within the search window for potential cell placement refinements to determine whether circuit timing can be improved through incremental changes in the placement result 74. In a current embodiment, entire cells inside the search window are evaluated. Each cell is tested within a search window to determine how movement of the cell will impact timing characteristics. Numerous possible changes in cell placement locations are evaluated. Cells that have pins disposed on a critical path may have target zones associated with them. In accordance with a present embodiment, when a proposed change in cell location involves a change in the location of a cell that includes a critical path pin, the evaluation of whether the change will improve or degrade overall circuit timing involves identification at least one target zone derived from one or more candidate zones associated with one or more critical path pins.

In search, evaluate and move block 112, an evaluation of a proposed cell movement based upon target zones involves a determination of whether a cell would be placed inside or outside its own target zone as a result of the proposed placement. It will be appreciated that no contemporaneous involvement of the timing engine is required during the evaluation of detailed cell placement. That is, no contemporaneous delay calculation is required to determine whether or not a timing requirement is met. Rather, a target zone implicitly incorporate previously derived timing information. More particularly, a determination of whether a respective proposed cell movement would place a cell inside or outside its own respective target zone provides an indication of the impact upon circuit timing of the proposed cell placement. In a current embodiment, a respective proposed cell movement that results in placement of a cell inside its own target zone is evaluated as having an acceptable timing impact. A respective proposed cell movement that results in a placement of the cell outside its own respective target zone is evaluated as having a detrimental timing impact.

In a present embodiment, a measure of the timing cost of a proposed move of a cell is produced based at least in part upon a proposed placement location of a respective cell relative to its target zone. If a proposed placement of the cell is within the target zone then the cost is minimal or even zero. If a proposed placement of the cell is outside its target zone the cost is greater. This increased cost represents a timing penalty associated with the proposed movement. Thus, in essence, a timing penalty is identified for proposed respective cell placements based upon their locations relative to the respective target zones of the cells.

For example, in one embodiment, a target zone associated cost can be associated with proposed cell movements. For instance, movement of a cell from a first location inside a target zone to a second location inside a target zone might have a target zone associated cost penalty of zero. A movement of a cell from inside a target zone to outside a target zone might have a positive target zone associated cost value penalty that increases in magnitude with the distance of the proposed placement from the target zone. Conversely, a proposed cell movement from a first location outside the target zone to a second location inside the target zone might have a negative target zone associated cost value penalty with a magnitude that increases with the decreasing distance of the second location from the first location.

More specifically, for instance, if a cell is moved into or remains within its own target zone then the component of cost associated with the cell's target zone of this movement might be prescribed to be zero. If, however, the movement moves the cell outside of its zone by a distant "d" from the target zone boundary, then the movement might be prescribed to have a higher target zone related cost component. For instance, the cost might be proportional to $d^2$.

The detailed placement process involves a rigorous search for improved cell placement after the global placement process. The search involves determinations of the possible timing impact of numerous potential cell movements to determine which of the numerous possible movements to implement. Target zones are used advantageously to more quickly evaluate the timing impact of alternative cell movements in the course of such a search for improved cell placements. For instance, simple inequalities can be used to assess whether a proposed cell movements will place the cell inside or outside a target zone. Thus, target zones provide an indication of the impact upon design circuit timing that may result from incremental changes in the placement of one or more cells. The use of target zones can obviate the need to actually contemporaneously compute a new delay that is likely to result from an incremental change in cell placement. Such delay computations generally are more time consuming than the calculations involved in merely determining whether a new cell placement will be inside or outside a target zone. Since the search involved in detailed placement ordinarily involves evaluations of perhaps hundred thousands or even millions of proposed cell movements, the savings in computation effort achieved through the use of target zones can be significant.

More specifically, in a presently preferred embodiment of the invention, search window decision block 111 determines whether a new search window is required. Search window definition block 113 defines a new search window if required. In a present embodiment, the search window size increases with the number of detailed placement iterations. For example, during an earlier stage of the detailed placement process, cells of the circuit design are evaluated using a smaller search window. As the number of detailed placement iterations increases, block 113 gradually increases the size of the search window. As a result, for example, the size of the search window will be larger later in the detailed search process.

In a current embodiment, the detailed search involves an evaluation of the proposed placement of each cell in the circuit design. The search proceeds in an orderly fashion so that the proposed placement of each and every cell in the circuit design is evaluated. For a given cell with a given search window, for instance, an evaluation is made of one or more proposed detailed search movements. Proposed detailed search movements are limited to the region of the circuit design circumscribed by the search window. Proposed detailed search movements involve not only the given cell that currently is under evaluation, but also other cells that may have to be moved or squeezed to accommodate the proposed movement of the cell under evaluation. Thus, the timing impact of a proposed detailed search movement includes no only the timing impact due to the proposed movement of the particular cell under evaluation, but also the timing impact of the proposed move upon any other cells that must be moved or squeezed to accommodate the proposed movement. The signal timing impact of each proposed detailed search movement is evaluated, and the proposed detailed search movement with the most beneficial timing impact is implemented.

In a present embodiment of the invention, the same search window is applied by the search evaluate and move block 112 to every cell of the design. A detailed search iteration is complete when the proposed placement of every cell in the design has been evaluated. The search window essentially slides across the placement region. Each cell, in turn, is centered in the search window while the proposed placement of that cell is evaluated. At the end of a detailed search iteration, decision block 111 determines that a new search window is required, and block 113 defines a search window with an increased size. The detailed search evaluate and move block 112 then again evaluates the proposed placement of every cell in the circuit design, this time within a larger search window.

In a present embodiment of the invention a proposed detailed search movement for a respective cell might, for example, involve not only a movement of the respective cell under evaluation but other cells as well. For instance, a proposed detailed search movement might involve the swapping of the placement of a respective cell under evaluation with another cell inside the search window. In that case, an evaluation of the proposed detailed search movement would involve an assessment of the signal timing impact of the movement of both the respective cell under evaluation and an assessment of the signal timing impact of the movement of the cell with which it is proposed to swap placements. Alternatively, for example, a proposed detailed search movement might involve squeezing the area in which another cell is located. For instance, a proposed detailed search movement might involve moving the respective cell under evaluation to a region of the circuit design not currently occupied by another cell. Nevertheless, it may be necessary to squeeze another cell within the search window into a smaller region than it occupied before. In that case, an evaluation of the proposed detailed search movement would involve an assessment of the signal timing impact of the movement of both the respective cell under evaluation and an assessment of the signal timing impact of squeezing the area occupied by the other cell.

An evaluation of the signal timing impact of such proposed detailed search movements encompass an accumulation of the timing impact due to the movement of the respective cell under evaluation and the timing impact due to the movements or squeezing of other cells within the search window. Several proposed detailed search movements may be considered for a given cell under evaluation. In general, proposed detailed search movement with the most beneficial overall timing impact is implemented. Other factors, such as routability and wire length may have a greater impact upon selection of a proposed detailed search movement if critical path timing is not a major issue. Of course, a set of proposed detailed search movements includes an entry in which no cell movements are made.

For instance, assume that a first proposed detailed search movement involves swapping the placement of a respective cell under evaluation with a placement of another cell in the search window. The signal timing impact of the first proposed detailed search movement would involve the target zone related timing costs of the movement of the cell under evaluation plus timing costs associated with changes in wire length and changes in routability associated with the cell under evaluation. The target zone related timing costs would be weighted much more heavily in determining the overall signal timing impact of the movement of the respective cell under evaluation. Additionally, the signal timing impact of the first proposed detailed search movement would involve the target zone related timing costs of the movement of the cell to be swapped plus timing costs associated with changes in wire length and changes in routability associated with the cell to be swapped. An evaluation of the signal timing impact of the first proposed detailed search movement would involve a combined assessment of the signal timing impacts of the movement of the cell under consideration and the swapped cell.

Now assume that a second proposed detailed search movement involves moving the placement of the same respective cell under evaluation into an open location within the search window. Further assume that this movement will require that the area occupied by another cell within the search window be squeezed. The signal timing impact of this second proposed detailed search movement encompasses the combined signal timing impact of the movement of the cell under evaluation and the squeezing of the other cell. Thus, the target zone associated timing impact plus the wire length timing impact plus the routability timing impact of the movements of both the cell under evaluation and the cell to be squeezed must be considered.

In the above example, as between the first proposed detailed search movement and the second proposed detailed search movement and a third proposed detailed search movement in which no cells are moved, the detailed search movement with the more beneficial signal timing impact will be implemented.

RC update block 114 calculates changed RC values resulting from the new cell (x,y) locations resulting from each new cell placement implemented by the movement search and evaluate block 112. For a given cell within a given search window, block 112 may evaluate numerous different possible new cell placements. Block 112 will select a placement based upon cost penalty derived from the given cell's target zone (if it has one). After many cells in the search window have been placed in new locations, the RC update block 114 computes the new RC values described above. For instance, after perhaps 100 or 1,000 cell movements in the given search window, block 114 is called to compute new RC values for the new cell placements.

Target zones are derived (or revised) after each delay analysis (full, incremental or local) by the computer software associated with blocks 110, 118 or 120. Each of the delay traces accesses information in the timing database 88. The user's timing constraints, timing model, library information (both logical and physical) and the RC estimation may be used by the delay traces to calculate the delay of all paths under consideration and to calculate slack information.

A full delay trace analysis constructs all path delay information and all slack information for the entire circuit design. An incremental delay trace analysis incrementally constructs new path delay and new slack information for increments of the circuit design for which cells have been moved in the course of one or more iterations by block 112 and propagates the changes through the entire circuit design. A local delay trace analysis constructs new path delay and slack information for only those parts of the circuit that have changed in the course of one or more iterations by block 112, but it does not propagate the results through the circuit design. Both the full delay trace and the incremental delay trace produce accurate timing information. However, the incremental delay trace can be performed faster than the full delay trace if only a small portion of the overall circuit has changed. A local delay trace can be performed much faster than the incremental delay trace, but it can result in some error margin. Generally, after a local delay trace has been performed a few times, a full or incremental delay trace is required to regain timing accuracy. Timing information produced by a local or incremental delay trace is stored in the timing database 88.

More specifically, decision block 116 determines whether either an incremental delay trace or a full delay trace is required. For instance, an incremental delay trace might be prescribed as required after 500 or 1,500 cell movements by block 112, for example. A full delay trace might be required after 2,500 cell movements, for example. If block 116 determines that neither an incremental nor a full delay trace is required at this time then local delay trace and target zone update block 118 performs a local delay trace. Upon completion of its function, block 118 passes control to new search window decision block 111. If block 116 determines that at least one of an incremental delay trace or a full delay trace is required at this time then decision block 121 determines whether it is an incremental or a full delay trace that is required. If an incremental delay trace is required, then incremental delay trace block 120 performs an incremental delay trace and revises target zones accordingly. If a full delay trace is required then full delay trace block and target zone determination block 123 performs a full delay trace and revises target zones accordingly. Upon completion of its respective function, block 120 or block 123 (as the case may be) passes control to decision block 122 which determines whether circuit quality is met or a run time limit has been reached. Circuit quality depends primarily upon critical path timing requirements. Circuit quality depends to a lesser extend upon factors such as routability and wire length.

Generally, the control loop of the detailed timing process 104 will iterate several times for a given search window before the results converge. If block 122 determines that neither quality nor a run time limit has been me, then it passes control to new search window block 111. If block 122 determines that quality or run time limit has been achieved, the detailed placement process ends.

New search window decision block 109 determines whether a new search window should be defined. If a new search window is required, then control is passed to block 110. If no new search window is required, then control is passed to block 112.

The result of the global placement process and the detailed placement process is a specification of functional cell connectivity and physical placement on in integrated circuit. Thus, the result of the global placement and detailed placement processes is a specification for a physical implementation of an integrated circuit. This integrated circuit specification can be used to control the actual formation of the physical circuit in a physical carrier such as a semiconductor wafer. The actual formation depends upon the design rules for the particular fabrication process used to create the physical circuit. Design rules are well known to those skilled in the art and are heavily dependent upon the semiconductor fabrication process. The design rules generally include the cell library 68 and design parameters specification 70 which are a part of the design database_66 during global and detailed placement. Thus, the present invention also enables the production of a novel integrated circuit in which the physical placement and connectivity of functional cells of the circuit is specified by the result of the global and detailed placement processes in accordance with the present invention.

Figure 8:
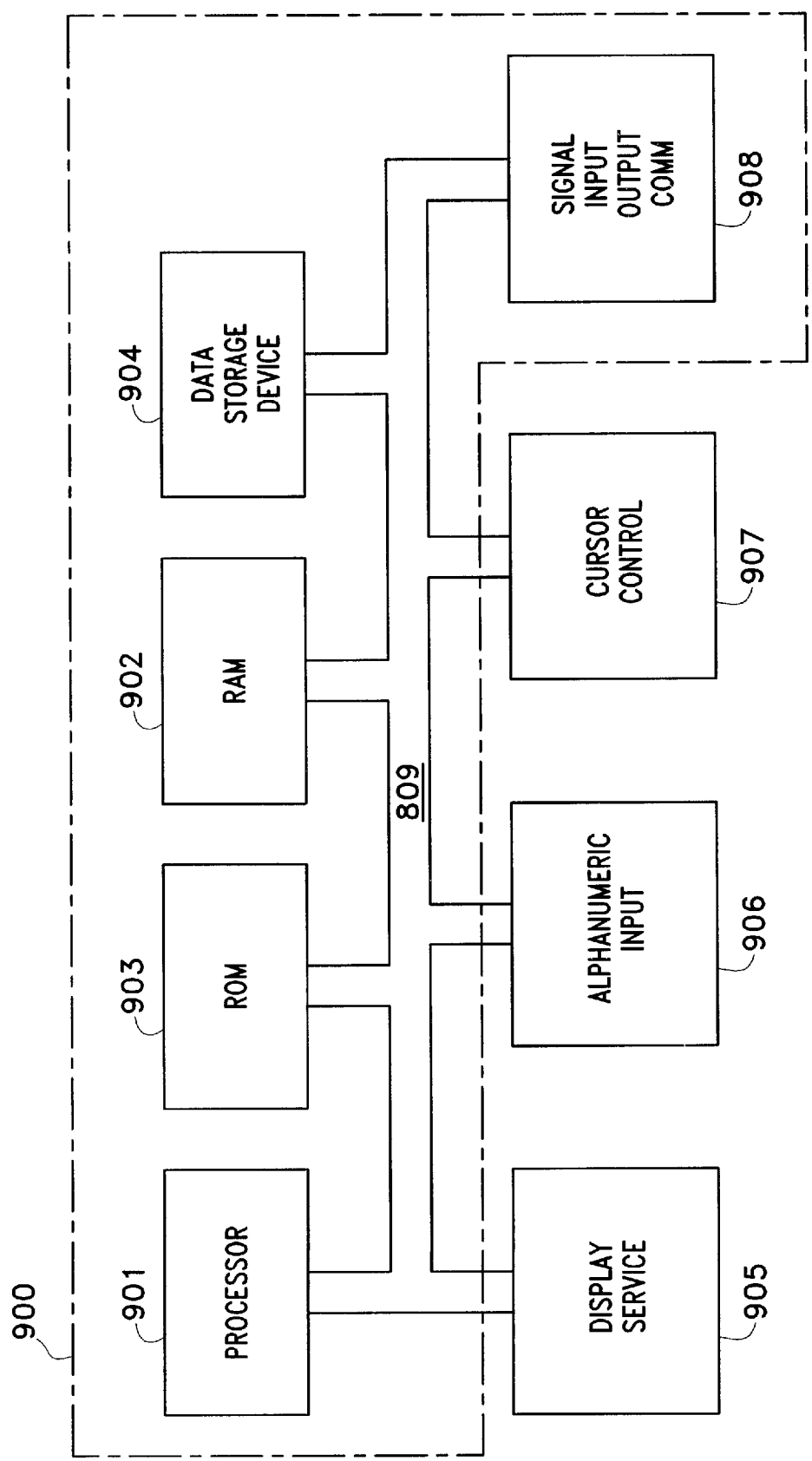
FIG. 8 is an illustrative drawing of an example of a computer system upon which the present invention maybe implemented or practiced.

FIG. 8 illustrates an exemplary computer system 900 upon which the present invention may be implemented or practiced. It is appreciated that the computer system 900 of FIG. 8 is exemplary only and that the present invention can operate within a number of different computer systems including general purpose computers systems, embedded computer systems, and computer systems specially adapted for electronic design automation. Computer system 900 of FIG. 8 includes an address/data bus 909 for conveying digital information between the various components, a central processor unit (CPU) 901 for processing the digital information and instructions, a random access memory (RAM) 902 for storing the digital information and instructions, a ready only memory (ROM) 903 for storing information and instructions of a more permanent nature. In addition, computer system 900 may also include a data storage device 904 (e.g., a magnetic, optical, floppy, or tape drive) for storing vast amounts of data, and an I/O interface 908 for interfacing with peripheral devices (e.g., computer network modem, etc.). Devices which may be coupled to computer system 900 include a display device 905 for displaying information (e.g., channel grid map, vertical constraint graphs, weighting functions, feasible links, etc.) to a computer user, an alphanumeric input device 906 (e.g., a keyboard), and a cursor control device 907 (e.g., mouse, trackball, light pen, etc.) for inputting data and selections.

It will be understood that the foregoing description and drawings of preferred embodiment in accordance with the present invention are merely illustrative of the principles of this invention, and that various modifications can be made by those skilled in the art without departing from the scope and spirit of the invention.

What is claimed is:

1. A method of determining placement of functional cells of a circuit design on a carrier using a computer and a computer readable storage medium, a specification of connectivity among cells of the circuit design and a specification of signal timing requirements among cells of the circuit design, the method comprising:

producing at least one information structure in the storage medium that provides indications of connectivity relationships among cells of the circuit design;

determining respective predicted criticality of respective paths among cells defined by respective connectivity relationships between respective cells of the circuit design;

allocating at least a portion of the storage medium to store proposed cell placement information for the circuit design;

providing a recursion limit; and recursively, determining respective proposed placement criticality of respective paths among cells of the circuit design based on a current proposed placement of the cells;

determining respective current weights corresponding to respective connectivity relationships based upon respective predicted and respective proposed placement criticality of respective paths among cells defined by such respective connectivity relationships;

associating, in the storage medium, respective current weights with corresponding respective connectivity relationships; and modifying respective cell placement information in the storage medium based on respective connectivity relationships and respective current weights in the storage medium to produce a current proposed placement of the cells in the circuit design; and continuing to recurs until the limit is reached.

2. The method of claim 1 further including:

providing, in the storage medium, a representation of one or more placement regions that correspond to at least a portion of the carrier; and wherein modifying respective cell placement information results in modification of one or more respective current proposed cell placements in one or more of the placement regions.

3. The method of claim 1 further including:

providing, in the storage medium, a representation of one or more placement regions that correspond to at least a portion of the carrier; and wherein modifying respective cell placement information results in modification of one or more respective current proposed cell placements in one or more of the placement regions in accordance with a quadratic optimization process.

4. The method of claim 1 wherein determining respective proposed physical placement criticality further includes:

analyzing respective current signal timing for respective paths among cells of the circuit design based on a current proposed physical placement of cells;

comparing the respective current signal timing for respective paths for the current proposed physical placement of cells with specified signal timing for the respective paths.

5. The method of claim 1 wherein determining respective predicted criticality further includes:

analyzing respective predicted signal timing for respective paths among cells of the circuit design based on a statistical model of cell placement;

comparing the respective predicted signal timing for respective paths for the statistical model of cell placement with specified signal timing for the respective paths.

6. The method of claim 1, wherein determining respective current weights involves increasing the relative importance of respective proposed placement criticality with increasing convergence upon the recursion limit.

7. The method of claim 1, wherein determining respective current weights involves increasing the relative importance of respective proposed placement criticality with increasing number of recursions.

8. The method of claim 1, wherein providing a recursion limit includes establishing a run time limit; and wherein determining respective weights involves increasing the relative importance of respective current proposed placement criticality with convergence upon the run time limit.

9. The method of claim 1, wherein providing a recursion limit includes establishing a prescribed timing quality; and further including:

determining current timing quality after arranging respective cells of the circuit design to produce a proposed placement of the cells;

wherein determining respective weights involves increasing the relative importance of respective proposed physical placement criticality with convergence of current timing quality upon the prescribed timing quality.

10. The method of claim 1 further including:

partitioning one or more placement regions into smaller placement regions with successive recursions;

wherein providing a recursion limit involves providing a target placement region size;

wherein modifying respective cell placements involves placing respective cells in increasingly smaller placement regions with successive recursions.

11. The method of claim 1 further including:

partitioning the one or more placement regions into smaller placement regions with successive recursions;

wherein providing a recursion limit involves providing a target partition region size and cell density within placement regions;

wherein modifying respective cell placements involves placing respective cells in increasingly smaller placement regions with successive recursions;

wherein providing a recursion limit includes establishing a target placement region size; and wherein determining respective weights involves increasing the relative importance of respective proposed placement criticality with convergence upon the target placement size and the cell density within placement regions.

12. The method of claim 1 further including:

partitioning the placement region into smaller partition regions with successive recursions;

wherein providing a recursion limit involves providing a target partition region size;

wherein modifying respective cell placements involves placing respective cells in increasingly smaller partition regions with successive recursions;

wherein providing a recursion limit includes establishing a target partition size; and wherein determining respective weights involves increasing the relative importance of respective proposed placement criticality with convergence upon the target partition size.

13. The method of claim 1 further including:

partitioning the placement region into smaller partition regions with successive recursions;

wherein providing a recursion limit involves providing a target partition region size and cell density within partition regions;

wherein modifying respective cell placements involves placing respective cells in increasingly smaller partition regions with successive recursions;

wherein providing a recursion limit includes establishing a target partition size; and wherein determining respective weights involves increasing the relative importance of respective proposed physical placement criticality with convergence upon the target partition size and the cell density within partition regions.

14. The method of claim 1, wherein determining respective proposed placement criticality further includes:

analyzing respective current signal timing for respective paths among cells of the circuit design based on a current proposed placement of cells; and comparing the respective current signal timing for respective paths for the current proposed physical placement of cells with specified signal timing for the respective paths; and wherein determining respective predicted criticality further includes:

analyzing respective predicted signal timing for respective paths among cells of the circuit design based on a statistical model of cell placement; and comparing the respective predicted signal timing for respective paths for the statistical model of cell placement with specified signal timing for the respective paths.

15. The method of claim 1, wherein at the start of a first recursion there is no current placement; and wherein during a first recursion determining of respective current weights involves determining based upon respective predicted criticality without consideration of respective proposed physical placement criticality.

16. A method of placement of functional cells of a circuit design on a carrier using a computer and a computer readable storage medium, the method comprising:

providing a database of information in the storage medium which indicates connectivity relationships among functional cells and proposed overall physical placement of functional cells and signal timing requirements among cells;

defining respective target zone information respectively associated with respective cells of the circuit wherein respective target zones provide respective indications of the respective timing impact of changes in placement of respective associated cells;

storing respective target zone information in the storage medium;

providing a recursion limit; and recursively,
determining whether a new search window is required;
specifying a new search window if required;
for each of a multiplicity of respective cells in the circuit design,
conducting a respective search for an improved placement of the respective cell within the search window by respectively evaluating one or more respective proposed detailed search movements, the respective evaluations including,
for each one or more respective cells that is proposed to be moved pursuant to a respective proposed detailed search movement and that is associated with respective target zone information, respectively assessing respective timing impact of the respective proposed detailed search movement based upon the respective target zone information associated with the respective cell;
respectively determining which, if any, proposed detailed search movement for the respective cell that is subject of the respective search to implement based upon the evaluations of the one or more proposed detailed search movements; and
respectively implementing the respective detailed search movement for the respective cell that is the subject of the respective search based upon the respective determination;
updating respective target zone information in the storage medium after a plurality of cell movements;
continuing to recurs until the recursion limit is reached.

17. The method of claim 16, wherein the respective evaluations further include,
for each one or more respective cells that is proposed to be moved pursuant to a respective proposed detailed search movement, assessing at least one of the impact on wire length or the impact on routability of the respective proposed detailed search movement.

18. The method of claim 16, wherein respective target zone information further provides an indication of which movements of a respective associated cell will have an unacceptable signal timing impact.

19. The method of claim 16, wherein respective target zone information defines a respective region of the overall physical placement within which a respective associated cell can be moved without incurring a significant signal timing impact.

20. The method of claim 16 wherein defining respective target zones includes:

generating respective RC delay values associated with respective connectivity paths specified for the respective cells of the proposed cell placement;

performing a delay trace of the connectivity paths and associated RC values of the proposed cell placement so as to identify respective critical paths;

defining respective target zones for respective cells disposed on respective critical paths such that respective target zones provide respective indications of how movement of respective associated cells will influence timing performance of the circuit design.

21. The method of claim 16 wherein updating respective target zones includes:

generating respective updated RC delay values associated with respective connectivity paths specified for the respective cells of the proposed cell placement;

performing a local delay trace if a first number of cell movements has occurred since the last local delay trace;

performing an incremental delay trace if a second number of cell movements has occurred since the last incremental delay trace where the second number is greater than the first number; and performing a global delay trace if a third number of cell movements has occurred since the last global delay trace where the third number is greater than the second number.

22. The method of claim 16 wherein defining respective target zones includes:

identifying respective cells with one or more respective pins disposed on a respective critical path of the circuit design;

for individual respective identified critical path cells, determining respective desired interconnect delay timing limits associated with respective critical path pin pairs that respectively include at least one respective critical path pin; and defining a respective associated target zone region within which respective placement of such individual respective critical path cell is likely to satisfy critical path timing requirements in view of respective determined desired interconnect delay timing limits.

23. The method of claim 16 wherein defining respective target zones includes:

identifying respective cells with one or more respective pin disposed on a respective critical path of the circuit design;

for individual respective identified critical path cells, determining respective desired timing delay limits associated with respective nets that respectively include respective at least one critical path pin wherein respective timing delay limits include respective net loading delays; and defining a respective associated target zone region within which respective placement of such individual respective critical path cell is likely to satisfy critical path timing requirements in view of respective determined timing delay limits.

24. The method of claim 16 wherein defining respective target zones includes:

identifying respective cells with one or more respective pins disposed on a respective critical path of the circuit design;

for individual respective identified critical path cells, determining respective desired interconnect delay timing limits associated with respective critical path pin pairs that respectively include at least one respective critical path;

determining respective net loading delay limits associated with respective critical path pins;

determining respective desired timing delay limits respectively associated with respective critical path pins, wherein for each respective individual critical path pins, respective desired timing delay limits encompasses both a respective pin pair interconnect delay limit and a respective net loading delay limit associated with such respective individual critical path pin; and defining a respective associated target zone region within which placement of such individual respective critical path cell is likely to satisfy respective desired timing delay limits of the one or more critical path pins associated with such respective individual critical path cell.

25. The method of claim 16 wherein defining respective target zones includes:

identifying respective cells with at least one respective pin disposed on a respective critical path of the circuit design;

for respective identified critical path cells, determining respective pin pair interconnect delay limits respectively associated with respective critical path pins;

determining respective net loading delay limits respectively associated with respective critical path pins;

determining respective desired timing delay limits respectively associated with respective critical path pins, wherein the respective desired timing delay limits for individual critical path pins respectively encompass both respective corresponding pin pair interconnect delay limits and respective corresponding net loading delay limits; and defining respective candidate zones respectively associated with respective critical path pins, wherein respective individual candidate zones for respective individual critical path pins respectively define respective individual placement regions within which placement of respective associated critical path pins is most likely to satisfy respective desired timing requirements respectively associated with such respective critical path pins;

defining a respective target zone for such respective identified critical path cell as including a respective overlap placement region in which respective candidate zones of all of the one or more critical path pins respectively associated with such critical path cell overlap.

26. The method of claim 16 wherein, if a respective cell proposed to be moved is associated with a respective target zone, then assessing where the respective movement of such cell would place the cell relative to its target zone and by also assessing at least one of the impact on wire length or the impact on routability associated with such proposed cell movement.

* * * * *